(12) United States Patent
Vogt et al.

(10) Patent No.: US 9,856,419 B2
(45) Date of Patent: Jan. 2, 2018

(54) STABLE PHOSPHORS FOR LIGHTING APPLICATIONS

(75) Inventors: Thomas Vogt, Chapin, SC (US); Sonali Mitra, Columbia, SC (US)

(73) Assignee: University of South Carolina, Columbia, SC (US)

( * ) Notice: Subject to any disclaimer, the term of this patent is extended or adjusted under 35 U.S.C. 154(b) by 280 days.

(21) Appl. No.: 14/419,704

(22) PCT Filed: Aug. 8, 2012

(86) PCT No.: PCT/US2012/049890
§ 371 (c)(1),
(2), (4) Date: Sep. 16, 2015

(87) PCT Pub. No.: WO2014/025345
PCT Pub. Date: Feb. 13, 2014

(65) Prior Publication Data
US 2016/0009989 A1  Jan. 14, 2016

(51) Int. Cl.
*H01J 1/62* (2006.01)
*C09K 11/77* (2006.01)
*C09K 11/66* (2006.01)
*H05B 33/14* (2006.01)
*H01L 33/50* (2010.01)

(52) U.S. Cl.
CPC ........ *C09K 11/7735* (2013.01); *C09K 11/663* (2013.01); *C09K 11/775* (2013.01); *C09K 11/7718* (2013.01); *H01L 33/502* (2013.01); *H05B 33/14* (2013.01)

(58) Field of Classification Search
CPC .............. C09K 11/7734; C09K 11/663; C09K 11/7718; C09K 11/775; C01G 17/006
See application file for complete search history.

(56) References Cited

U.S. PATENT DOCUMENTS

| 2,447,448 | A | 8/1948 | Williams |
|---|---|---|---|
| 2004/0198581 | A1 | 10/2004 | Tran |
| 2008/0224163 | A1 | 9/2008 | Roth et al. |
| 2008/0296596 | A1 | 12/2008 | Setlur et al. |
| 2009/0189514 | A1 | 7/2009 | Hiramatsu et al. |
| 2009/0302236 | A1 | 12/2009 | Vogt et al. |
| 2010/0314993 | A1 | 12/2010 | Im et al. |

OTHER PUBLICATIONS

Search Report for corresponding PCT Application No. PCT/US12/49890 dated Oct. 12, 2012, 2 pages.
Mikhailik, V. B., et al. "Two-photon excitation and luminescence of a CaWO 4 scintillator." Radiation measurements 38.4 (2004): 585-588.
Blasse, G., and A. Bril. "Investigation of some Ce3+-activated phosphors." The journal of chemical physics 47.12 (1967): 5139-5145. Abstract Only.
Lempicki, A., et al. "LuAlO/sub 3: CC and other aluminate scintillators." IEEE Transactions on Nuclear Science 42.4 (1995): 280-284. Abstract Only.
Happek, U, J. Choi, and A. M. Srivastava. "Observation of cross-ionization is Gd 3 Sc 2 Al 3 O 12: Ce 3+." Journal of luminescence 94 (2001): 7-9. Abstract Only.
Shimomura, Yasuo, et al. "Photoluminescence and crystal structure of green-emitting Ca3Sc2Si3O12: Ce3+ phosphor for white light emitting diodes." Journal of The Electrochemical Society 154.1 (2007): J35-J38.
Xie, Rong-Jun, and Naoto Hirosaki. "Silicon-based oxynitride and nitride phosphors for white LEDs—A review." Science and Technology of Advanced Materials 8.7 (2007): 588-600.
Schneemeyer, L. F., et al. "Synthesis and Structure of a New Germanate Fluoride: NaCa 2 GeO 4 F." Journal of Solid State Chemistry 160.1 (2001): 33-38. Abstract Only.

*Primary Examiner* — Carol M Koslow
(74) *Attorney, Agent, or Firm* — Dority & Manning, PA

(57) ABSTRACT

Compositions are generally provided that include an oxyfluoride compound. In one embodiment, the oxyfluoride compound has the formula: $NaCa_{2-x}A_xGeO_{4-z}F_{1-y}N_z$ where A is Ba, Sr, or a mixture thereof; $0.01 \leq x \leq 0.1$; $0 \leq y \leq 0.2$; and $0 \leq z \leq 0.1$. Methods of forming such compounds are also generally provided.

15 Claims, 24 Drawing Sheets

STABLE PHOSPHORS FOR LIGHTING APPLICATIONS

BACKGROUND

Research in solid-state lighting and in particular on new phosphor materials for white-light emitting diodes (LEDs) can provide substantial energy savings and reduce our global environmental impact. Phosphors are materials capable of emitting photoluminescence when excited by radiation. They are used in LEDs, cathode ray tubes and sensors. LEDs are extensively used for applications in industrial and domestic lighting, indicator lights, traffic signs, automotive dashboards, and portable flash lights. Phosphors for lighting applications can be made in two ways: doping with activator ions or self-activation. Activator doped phosphors are prepared by doping activator ions in small concentrations into a host material. By direct excitation with light or by subsequent energy transfer, electrons populate the excited energy levels of the activator ions, and when they revert to the ground state, light emission referred to as photoluminescence takes place. The emitted radiation can have higher ("up-conversion") or lower ("down-conversion") energy than the energy of the excitation light. In another type of phosphor termed self-activating, the photoluminescence, is based on electron activation within subunits of the structure. Self-activating $CaWO_4$ has a blue emission band centered at about 420 nm which is caused by charge transfer within $WO_4^{2-}$ complexes, where the oxygen 2p electrons partially occupy the empty 5d orbitals of tungsten. Rare earth activated phosphors show line emission when excited by UV radiation, which causes the electrons to absorb photons and excite them to higher energy levels. Subsequently they relax back to the lowest vibrational energy level of the first excited state before finally returning to the ground state by emitting energy in the form of light. A broad band emission occurs when there is a shift in the equilibrium position upon excitation by photon absorption.

The most widely used phosphors for LEDs currently are oxides (e.g., $Ce^{3+}$-doped $Y_3Ga_5O_{12}$, $Lu_3Al_5O_{12}$, $Gd_3Sc_2A_{/3}O_{12}$ and $Ca_3Sc_2Si_3O_{12}$), nitrides (e.g., $Sr_2Si_5N_8$, $SiN_4$), or sulfides (e.g., $SrS:Eu^{2+}$, $SrGaS_4:Eu^{2+}$. $Y_3Al_5O_{12}$: $Ce^{3+}$ ($YAG:Ce^{3+}$)) that are used as a phosphor for blue-emitting $In_xGa_{1-x}N$ based LEDs as it efficiently absorbs part of the blue light and then emits bright yellow light to create cold white light.

Disadvantages associated with existing phosphors such as sulfides, nitrides and fluorides triggered the search for alternative materials with photoluminescent properties among them oxyfluorides. Many phosphors are not very stable chemically when exposed to air and humidity. This can lead to the emission of corrosive gases such as $H_2S$ and/or HF. Most phosphors undergo significant thermal quenching, e.g. $Sr_2SiS_4:Eu^{2+}$ has a $T_{1/2}$ value of 380 K, which is the temperature where the emission intensity becomes half of its value at room temperature. Thermal quenching processes occur when electrons in a material are excited and relax back to the ground state by nonradiative transitions since the excited state and ground state energy parabolas cross energies thermally accessible from the excited state. The excited electron reaches the ground state without emitting light and the photoluminescence intensity decreases as a consequence. Although nitride and/or oxynitride based phosphors, e.g. $Sr_2Al_2Si_{10}N_{14}O_4:Eu^{2+}$ have high efficiencies and chemical as well as thermal stability, these materials need to be prepared using complex and expensive synthesis conditions. Fluoride phosphors, such as $K_2TiF_6:Mn^{4+}$, $K_2SiF_6:Mn^{4+}$, $NaYF_4$ doped with $Yb^{3+}$, $Er^{3+}$, $Tm^{3+}$, are not very stable materials in air and humidity. Oxyfluorides are more stable compounds than fluorides with respect to hydrolysis. The presence of fluorine in the structure positively affects the photoluminescence properties of the phosphors: due to the 'softer' phonon modes at lower energies associated with the fluorine atoms in the lattice, thermal quenching is often reduced. Studies have been done on the PL properties of rare earth cation ($Eu^{3+}$, $Ce^{3+}$, $Tm^{3+}$, $Tb^{3+}$) doped $Sr_3AlO_4F$ that show strong line emissions. The low phonon energy in the fluoride environment decreases the possibility of non-radiative transfers of electrons between energy levels of doped rare earth elements. Im et. al. have shown that the photoluminescence intensity of the oxyfluoride compounds $Sr_{2.975-x}Ba_xCe_{0.025}AlO_4F$ is about 150% that of commercial $YAG:Ce^{3+}$ and its quantum efficiency at room temperature was near 95% due to its lower thermal quenching. One disadvantage of this oxyfluoride family is that the materials degrade albeit slowly when in contact with moisture. However dry preparation methods and proper handing can mitigate this problem.

Magnesium fluorogermanate is an oxyfluoride studied previously whose structural units are the same as those present in $NaCa_2GeO_4F$ namely $F^-$ anions and $GeO_4$ tetrahedral units. Magnesium germanate phosphors containing only $GeO_4$ tetrahedral subunits were discovered as early as 1936 by Leverenz, who prepared weakly luminescent $Mn^{4+}$ ($^4A_{2g}$ to $^4T_{1g}$ and to $^4T_{2g}$ transitions) doped meta-magnesium germanate ($MgGeO_3$) and ortho-magnesium germanate ($Mg_2GeO_4$). In 1948, Williams improved the luminescence efficiency of $Mg_{1.99}Mn_{0.01}GeO_4$ 5 fold when synthesizing $Mg_{3.99}Mn_{0.01}GeO_4$. This phosphor emits intense red light under UV excitation and its efficiency does not change at temperatures as high as 300° C. making it suitable for use in compact fluorescent lamps (CFL)s based on high pressure mercury lamps as described in U.S. Pat. No. 2,447,448. In 1950, Thorington reported that the photoluminescent efficiency of $Mn^{4+}$ activated magnesium germanate phosphor was doubled when introducing fluorine into the material resulting in the formation of a magnesium fluorogermanate. In 1972 Bless et. al. described this material to be $Mg_{28}Ge_{7.5}O_{38}F_{10}$ and its structure was found to be isomorphous with $Mg_{28}Ge_{10}O_{48}$, having an orthorhombic, space group Pbam, a=14.343(1), b=10.196(1), c=5.9075(4) Å. In $Mg_{28}Ge_{7.5}O_{38}F_{10}$, there are some vacancies in the Ge sites when compared to the $Mg_{28}Ge_{10}O_{48}$ structure and the $F^-$ anions substitute for some $O^{2-}$ sites for reasons of charge compensation. $Ge^{4+}$ cations are tetrahedrally coordinated by oxygen and located on two sites. The $Mn^{4+}$ activator occupies both the octahedral $Ge^{4+}$ sites and the $Mg^{2+}$ sites. This phosphor was subsequently used by Westinghouse Electric Company.

The synthesis of $NaCa_2GeO_4F$ was first reported by Schneemeyer et al. in 2001 and its structure is described as a hexagonal antiperovskite. $NaCa_2GeO_4F$ can be written as $X_3AB$ with $A=GeO_4^{4-}$, $B=F^-$ and $X=Na^+$, $Ca^{2+}$ to emphasize its relationship to the perovskite structure. An antiperovskite is a perovskite where the cation and anion sites are interchanged. $NaCa_2GeO_4F$, has an orthorhombic unit cell with lattice parameters, a=5.362(2) Å, b=7.328(3) Å, c=12.681(4) Å, V=498.3(3) Å³, space group Pnma (No. 62), Z=4.

Viewing down the a axis of the $NaCa_2GeO_4F$ structure reveals chains of isolated $GeO_4$ tetrahedra as shown in FIG. 1a. Chains of face-shared fluorine-centered octahedra with the calcium/sodium ions ($FM_6$, M=Ca/Na) are formed along the c axis (FIG. 1b). The $Sr_3XO_4F$ (X=Al, Ga)-type materials have an antiperovskite structure where the F⁻ ions are octahedrally coordinated by 6 $Sr^{2+}$ ions which are then connected by corner-sharing and the $(XO_4)^{5-}$ ions (X=Al, Ga) occupy the A-site within the voids of a $ReO_3$ network. To emphasize the antiperovskite structure these materials can be written as $(XO_4)FSr_3$. However, instead of face sharing as in $NaCa_2GeO_4F$, $Sr_3XO_4F$ structures have corner sharing octahedra. There is an axial elongation in the $FSr_6$ octahedra and a ~18° rotation about the c axis (FIGS. 1c and 1d). This is $a^0a^0c^-$ tilt system according to Glazer notation.

However, a need exists for further development of materials that can be used as phosphors in lighting applications, particularly in LEDs.

SUMMARY

Objects and advantages of the invention will be set forth in part in the following description, or may be obvious from the description, or may be learned through practice of the invention.

Compositions are generally provided that include an oxyfluoride compound. In one embodiment, the oxyfluoride compound has the formula:

$$NaCa_{2-x}A_xGeO_{4-z}F_{1-y}N_z$$

where A is Ba, Sr, or a mixture thereof; 0.01≤x≤0.1 (e.g., 0.01≤x≤0.06); 0≤y≤0.2; and 0≤z≤0.1. In particular embodiments, z is 0, and/or y is 0. For example, the oxyfluoride compound can, in one embodiment, have the formula:

$$NaCa_{2-x}A_xGeO_4F$$

wherein A is Ba, Sr, or a mixture thereof; and wherein 0.01≤x≤0.1 (e.g., 0.01≤x≤0.06).

An activator ion can be, in one embodiment, coupled with the compound, such as ions of La, Ac, Ce, Pr, Nd, Sm, Eu, Gd, Tb, Dy, Ho, Er, Tm, Yb, Th, U, Cr, Mn, Tc, Re, Cu, Ag, Au, Zn, Cd, Hg, As, Sb, Bi, Ge, Sn, Pb, In, Tl, or mixtures thereof.

In one particular embodiment, the composition includes an oxyfluoride compound having the formula:

$$NaCa_{2-x}A_xGeO_{4-z}F_{1-y}N_z$$

where A is Ba, Sr, or a mixture thereof; 0≤x≤0.1; 0≤y≤0.2; and 0≤z≤0.1; and an activator ion coupled with the compound. For example, x can be 0; z can be 0; and/or y can be 0. The activator ion can be an ion of an element selected from the group consisting of La, Ac, Ce, Pr, Nd, Sm, Eu, Gd, Tb, Dy, Ho, Er, Tm, Yb, Th, U, Cr, Mn, Tc, Re, Cu, Ag, Au, Zn, Cd, Hg, As, Sb, Bi, Ge, Sn, Pb, In, Tl, and mixtures thereof. In one embodiment, the activator ion comprises an ion of Eu (e.g., $Eu^{3+}$), Ce (e.g., $Ce^{3+}$), Tb (e.g., $Tb^{3+}$), or a mixture thereof.

Methods are also generally provided for doping a compound. The method can include, for example, introducing defects into a compound having the formula:

$$NaCa_2GeO_{4-z}F_{1-y}N_z$$

where 0≤y≤0.2; and 0≤z≤0.1, by substituting a portion of the Ca ions with ions of Ba, Sr, or a mixture thereof.

Other features and aspects of the present invention are discussed in greater detail below.

BRIEF DESCRIPTION OF THE DRAWINGS

A full and enabling disclosure of the present invention, including the best mode thereof to one skilled in the art, is set forth more particularly in the remainder of the specification, which includes reference to the accompanying figures, in which.

Figure 1A:
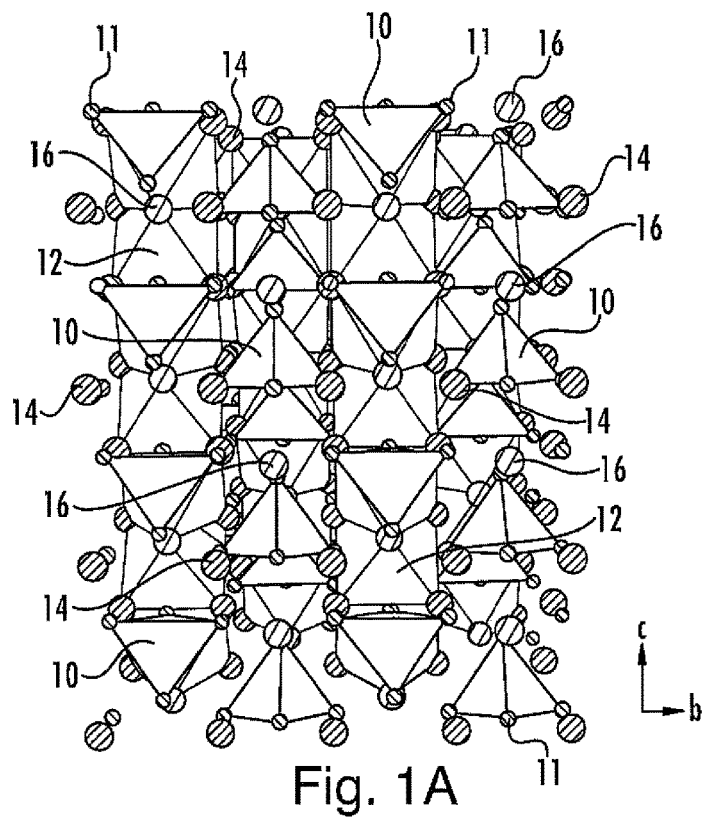
FIG. 1a the arrangement in $NaCa_2GeO_4F$ of $GeO_4$ tetrahedra (10, with oxygen atoms 11) and $FM_6$ octahedra (M=Na/Ca) (12), with different M sites shown as M1 (14) and M2 (16), along with the Ca—O bonds.
Figure 1B:
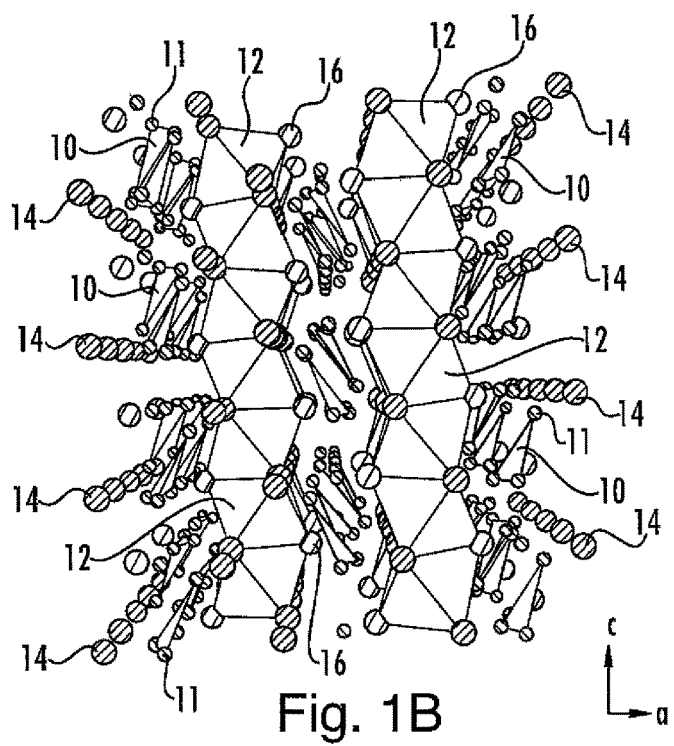
FIG. 1b shows the arrangement in $NaCa_2GeO_4F$ in a view of the face-shared fluorine-centered octahedra in the a-c plane.
Figure 1C:
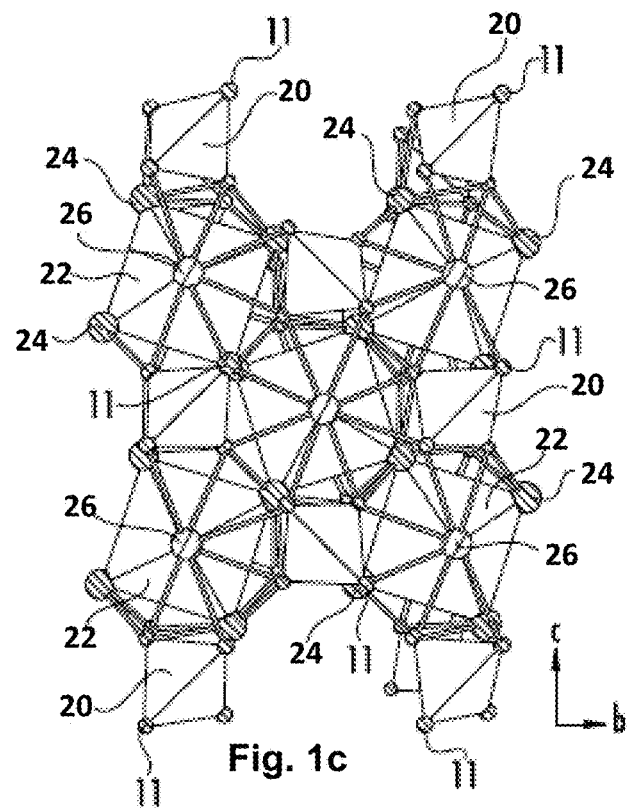
FIGS. 1c and 1d show the structure of $Sr_3XO_4F$ (X=Al, Ga) along a-c plane and b-c plane, respectively, as a comparison to the structure of $NaCa_2GeO_4F$ and showing the $XO_4$ tetrahedra (20), $FSr_6$ octahedra (22); oxygen atoms (11), and different Sr sites shown as 24 and 26 along with Ca—O bonds.
Figure 1D:
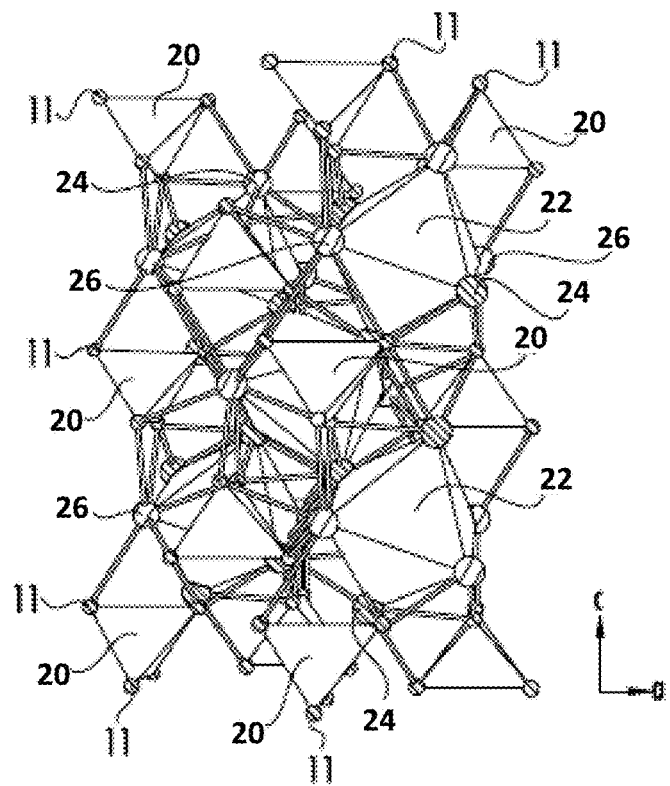

Repeat use of reference characters in the present specification and drawings is intended to represent the same or analogous features or elements of the present invention.

DETAILED DESCRIPTION

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

Chemical elements are discussed in the present disclosure using their common chemical abbreviation, such as commonly found on a periodic table of elements. For example, hydrogen is represented by its common chemical abbreviation H; helium is represented by its common chemical abbreviation He; and so forth.

In general, the present disclosure is directed to phosphors for use in light emitting devices.

I. Substituted Oxyfluoride Compounds

In one embodiment, an ordered oxyfluoride compound is generally provided that has the formula:

$$NaCa_{2-x}A_xGeO_{4-z}F_{1-y}N_z$$

where A is Ba, Sr, or a mixture thereof; $0.01 \leq x \leq 0.1$ (e.g., $0.01 \leq x \leq 0.06$); $0 \leq y \leq 0.2$; and $0 \leq z \leq 0.1$. In particular embodiments, z can be 0 (i.e., no nitrogen is present in the compound), and/or y can be 0. For example, in one particular embodiment, the oxyfluoride compound can have the formula:

$$NaCa_{2-x}A_xGeO_4F$$

wherein A is Ba, Sr, or a mixture thereof; and wherein $0.01 \leq x \leq 0.1$ (e.g., $0.01 \leq x \leq 0.06$). Such a oxyfluoride compound is generally a compound formed from a base compound $NaCa_2GeO_4F$, substituted with $Ba^{2+}$ and/or $Sr^{2+}$ for $Ca^{2+}$.

In one embodiment, A consists essentially of Ba (e.g., A consists of Ba). In an alternatively embodiment, A consists essentially of Sr (e.g., A consists of Sr).

II. Doped Oxyfluoride Compounds

Doped ordered oxyfluoride compounds are also generally provided. In one embodiment, any of the substituted oxyfluoride compounds discussed above can be doped with an activator ion. Alternatively, in one embodiment, the base oxyfluoride compound $NaCa_2GeO_4F$ can be doped with an activator ion.

Suitable activator ions for doping the oxyfluoride compounds (either of the substituted or base compounds) include ions of La, Ac, Ce, Pr, Nd, Sm, Eu, Gd, Tb, Dy, Ho, Er, Tm, Yb, Th, U, Cr, Mn, Tc, Re, Cu, Ag, Au, Zn, Cd, Hg, As, Sb, Bi, Ge, Sn, Pb, In, Tl, or mixtures thereof. Particularly suitable activator ions for doping the oxyfluoride compounds are ions of Eu (e.g., $Eu^{3+}$), Ce (e.g., $Ce^{3+}$), Tb (e.g., $Tb^{3+}$), or mixtures thereof.

Doping with rare earth elements allows white light emitting LEDs to be prepared by mixing green, blue and red light or yellow and blue light emitted from phosphors. Introducing suitable dopants in the oxyfluoride host lattice can result in the formation of novel down-conversion phosphors with desired emissions in the visible spectrum. Being a white powder, $NaCa_2GeO_4F$ has a large optical band gap (>3 eV) due to the energy difference between the oxygen 2p state and the Ca 3d and Ge 4s states. Having a large band gap is favorable for photoluminescence as both the ground and excited states of the activator ions can be accommodated within the electronic band gap of the host structure.

In particular embodiments, $Eu^{3+}$ and $Ce^{3+}$ can be chosen for doping. For example, the $Eu^{3+}$ ion is very efficient red light emitter mainly due to its $^5D_0 \rightarrow ^7F_0, ^7F_1, ^7F_2$ transitions. Alternatively, $Ce^{3+}$ doping can be used for its yellow emission due to its electronic transition from $5d^1$ to $^2F_{5/2}$ and $^2F_{7/2}$ and its role as a sensitizer.

Finding the optimum dopant concentration is important to avoid concentration quenching, which decreases the luminescence due to energy transfers via multipole-multipole interactions between emitting species. Germanates have good physical and chemical stability and some germanates, for example, $Ca_2GeO_4$ has already been shown to be good phosphor. $Ca_2GeO_4:Ce^{3+},Li^+$ exhibits a broad yellow emission band in the wavelength range of 480-750 nm under 465 nm excitation due to electronic transitions from 5d to 4f ($^2F_{5/2}$ and $^2F_{7/2}$).

$Ce^{3+}$ can act as a sensitizer when co-doped with $Eu^{2+}$. A study done by Sivakumar et. al. on $Sr_2LiSiO_4F$ has shown that, the co-doping of $Ce^{3+}$ increases the probability of the absorption of $Eu^{2+}$ in the UV to near-UV region as excitation spectra shows peaks at 830 and 330 nm. One observes broad-band emission from 360 to 620 nm (blue to green-yellowish) due to partial energy transfer from $Ce^{3+}$ to $Eu^{2+}$.

Bond valence sum (BVS) calculation is a method of determining bond strengths. The bond valence provides a metric to assess the stability of a structure.

$$\sum_j v_{i,j} = V_i$$

According to Pauling's electrostatic valence rule, the atomic valence of an atom is equal to the sum of valences of all its bonds.

$$v_{i,j} = \exp\left[\frac{R_{i,j} - d_{i,j}}{b}\right]$$

where $R_{ij}$ is tabulated bond distance, $d_{ij}$ is the observed bond distance and b is an empirical constant can be calculated as 0.37 Å from well refined structures. The M1 and M2 (Ca/Na) sites have the same coordination environment. The formal valence of M1 is 1.7 (0.7×2+0.3×1) and the one for M2 is 1.76 (0.73×2+0.27×1). The M1 site has a BVS value of 1.87, and BVS of M2 is 1.91. These two sites can be partially substituted with $Ba^{2+}$ and $Sr^{2+}$. As the $Sr^{2+}$ ion size is smaller (ionic radius 1.44 Å) than the $Ba^{2+}$ ion (ionic radius 1.61 Å), $Sr^{2+}$ can substitute slightly more of $Ca^{2+}$ (ionic radius 1.34 Å) (>0.06 mol %) than $Ba^{2+}$ (<0.05 mol %). The $NaCa_{2-x}Ba_xGeO_4F$ samples prepared under reducing atmosphere are self-activating and shows yellow luminescence when excited with 254 nm UV light.

EXAMPLES

Research on $Na_2CaGeO_4F$ and related compounds was done to investigate whether this oxyfluoride material can be a phosphor when doped with lanthanides and/or rare earth elements. This oxyfluoride is chemically very stable and in its structure distinct crystallographic sites for metal ions are present which can be occupied with suitable dopants taking into consideration the charge and cation size of the host lattice metal and dopant element.

Experimental: Synthesis of $Na_2CaGeO_4F$ $Na_2CaGeO_4F$ was synthesized by combining stoichiometric amounts of $CaCO_3$ (99.95%), $GeO_2$ (99.99%), NaF (99.9%) in a mortar and pestle. The ground mixture was heated in a furnace from at 850° C. for 12 h in a flowing nitrogen atmosphere. The resulting powder was reground, pressed into a pellet, and again heated to 850° C. for 12 hours.

Experimental: Substitution of Ca Ions in $Na_2CaGeO_4F$ $Ba^{2+}$ substituted materials, $NaCa_{2-x}Ba_xGeO_4F$ (x=0.01, 0.015, 0.02, 0.025, 0.035, 0.04, 0.045) were prepared by heating appropriate amounts of $CaCO_3$ (99.95%), $GeO_2$ (99.99%), NaF (99.9%), $BaCO_3$ (99.5%) under reducing gas (5% $H_2$/95% Ar) flow at 800° C. and 900° C. for 12 hrs respectively.

$Sr^{2+}$ substituted materials, $NaCa_{2-x}Sr_xGeO_4F$ (x=0.01, 0.02, 0.05, 0.06) were prepared by heating appropriate amounts of $CaCO_3$ (99.95%), $GeO_2$ (99.99%), NaF (99.9%), $SrCO_3$ (99.5%).

Experimental: Rare Earth Doping of $Na_2CaGeO_4F$

Rare earth doping using $Ce^{3+}$, $Eu^{3+}$, and $Tb^{3+}$ was performed by mixed appropriate amounts of $Ce_2O_3$, $Eu_2O_3$ and $Tb_4O_7$ with the above mentioned starting materials and heated at 950° C.

Characterization

The structures formed were refined based upon X-ray powder diffraction data recorded on a Rigaku Miniflex X-ray diffractometer with a Cu-Kα radiation source emitting a wavelength of 1.5406 Å. The 2θ data were recorded from 3.0 to 149 degree in 2θ with a step size of 0.02. The X-ray data were analyzed by Rietveld refinement using the GSAS software package. Lattice parameters and atomic sites for $NaCa_2GeO_4F$ in the orthorhombic Pnma space group were used as a starting model for the refinements. The atomic coordinates and isotropic displacement parameters of different atoms occupying the same site and the oxygen displacement parameters were constrained. The fractional occupancies were fixed to the nominal composition.

Results and Discussions

The lattice parameters from refinement are a=5.3665(2) Å, b=7.3270(5) Å, c=12.6871(6) Å, V=498.72(8) Å$^3$ which are in reasonable agreement within the given error values. The bond valence sum values calculated from the Schneemeyer data and our data are listed in Table 1. The BVS for M1 are almost equal, however, we observe a higher BVS value for M2 from our data due to a lower average $Ca_2$—O bond distances than that found by Schneemeyer et. al. in their single crystal refinement. The Ge—O bond distances are higher in our case as indicated by a lower BVS for Ge.

TABLE 1

BVS values for various atoms in $NaCa_2GeO_4F$ calculated from Schneemeyer data and this experimental data

| Atoms | Schneemeyer BVS | Mitra, Vogt BVS |
|---|---|---|
| Ge | 4.38 | 3.84 |
| M1 | 1.66 | 1.87 |
| M2 | 1.74 | 1.91 |
| F | 1.30 | 1.24 |
| O1 | 2.27 | 2.14 |
| O2 | 2.14 | 2.25 |
| O3 | 2.12 | 1.93 |

$Na_2CaGeO_4F$ is quite stable in air and moisture, as the comparison of X-ray diffraction data of a freshly prepared $Na_2CaGeO_4F$ and that of a 45 days old sample shows no significant change, but only a slight shrinkage of the lattice parameters of the aged sample. The lattice parameters obtained from a Rietvled refinement of the 45 days old sample were, a=5.3658(2) Å, b=7.3216(4) Å, c=12.6863(6) Å, V=498.40(8) Å$^3$ compared to the fresh sample lattice parameters a=5.3665(2) Å, b=7.3270(5) Å, c=12.6871(6) Å, V=498.72(8) Å$^3$. This chemical stability is in marked contrast to that observed for $Sr_3AlO_4F$ which degrade over days when in contact with moisture and air.

Structural characterization of $NaCa_{2-x}A_xGeO_4F$ (A=Ba, Sr and x=0.01, 0.015, 0.02, 0.025, 0.035, 0.04, 0.045)

Figure 2:
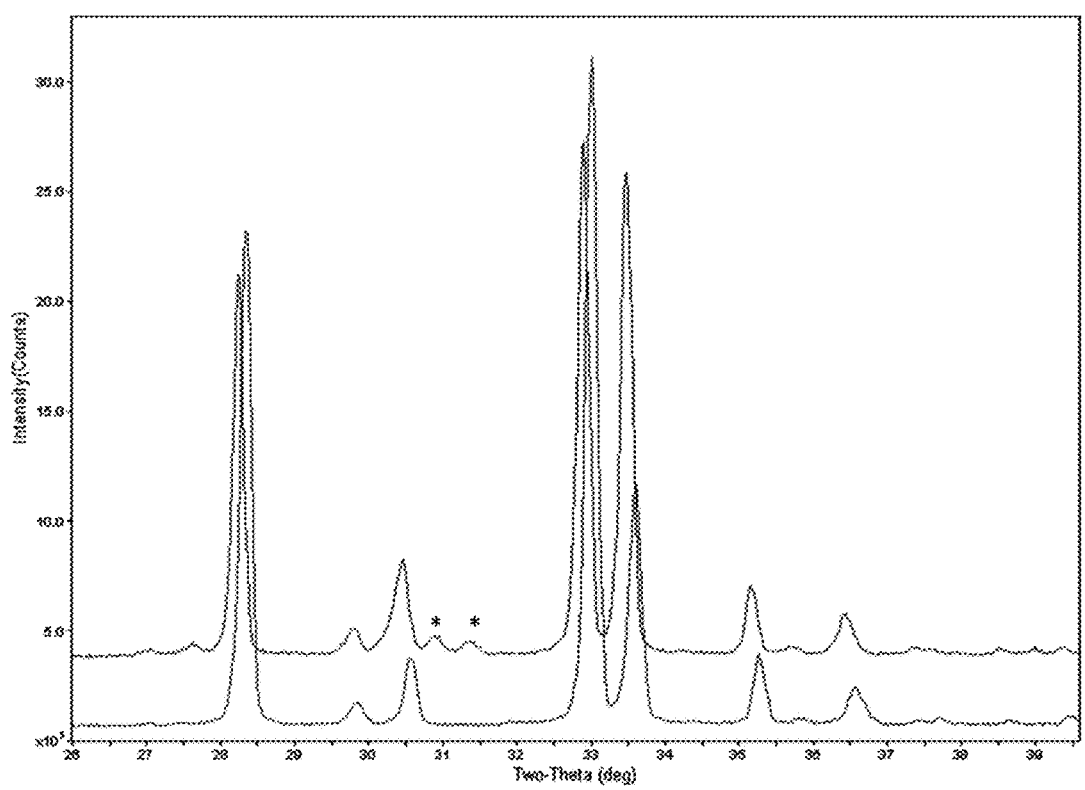
FIG. 2 shows the XRD peaks of $NaCa_{1.955}Ba_{0.045}GeO_4F$ (bottom line) and $NaCa_{1.945}Ba_{0.055}GeO_4F$ (top line) with $Ba_2Ge_5O_{12}$ impurity peaks shown by asterisks.
Figure 3:
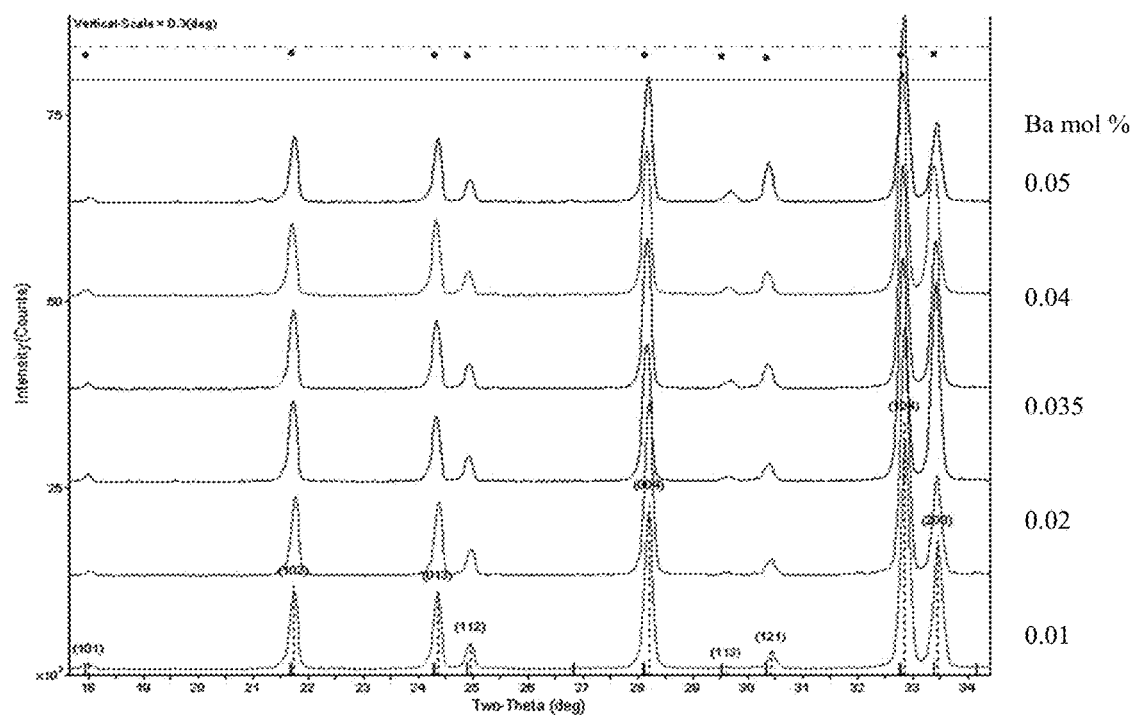
FIG. 3 shows the XRD peaks for different mol fractions of $Ba^{2+}$ substitution.
Figure 4A:
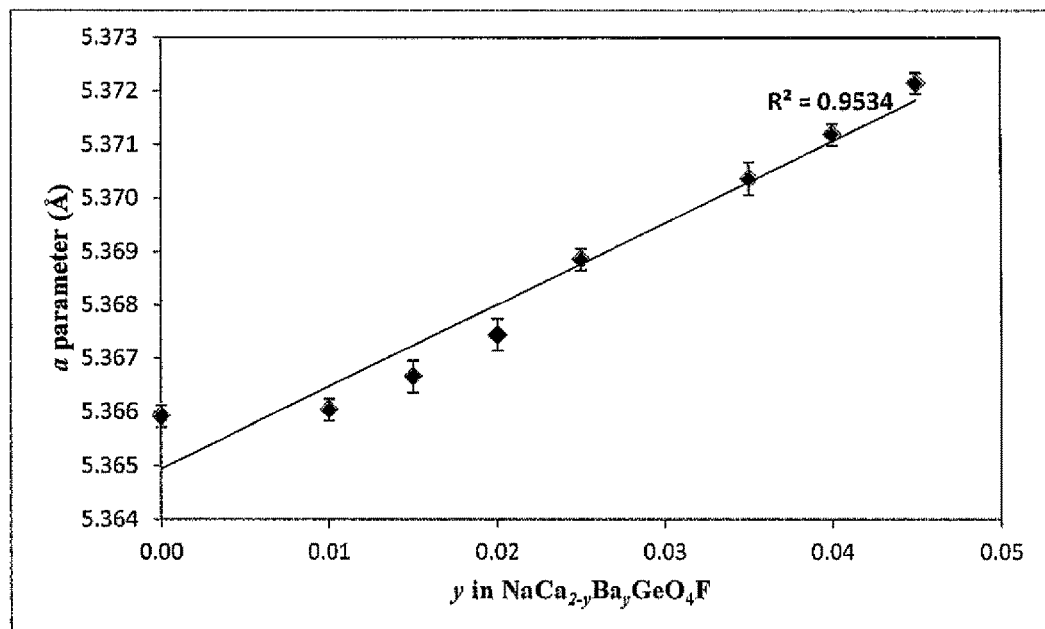
FIG. 4a shows a plot of lattice parameter a against various $Ba^{2+}$ concentrations in $NaCa_{2-x}Ba_xGeO_4F$ (x=0.01, 0.015, 0.02, 0.025, 0.035, 0.04, 0.045), with $R^2$ being the coefficient indicating how close the lattice parameter data scatter about a linear function of the $Ba^{2+}$ concentration.
Figure 4B:
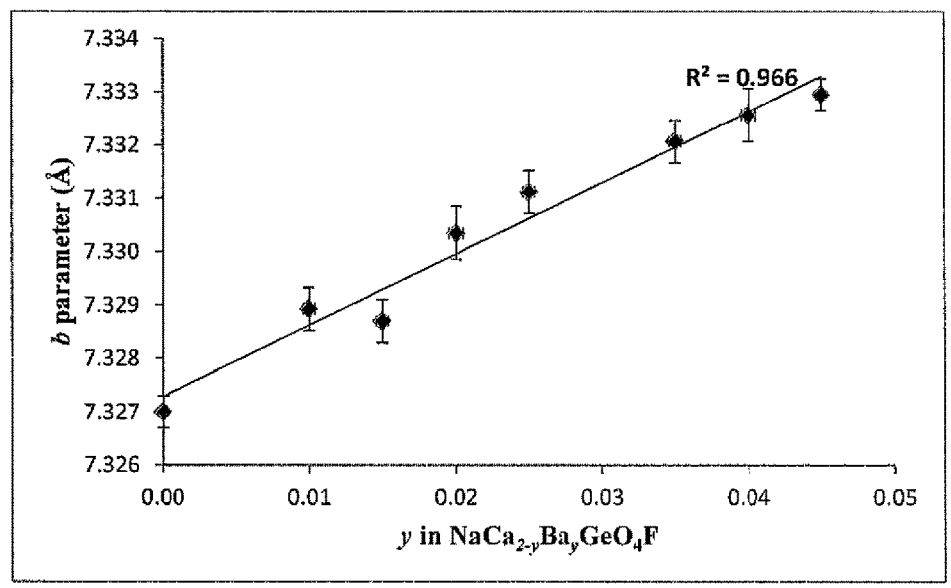
FIG. 4b shows the plot of lattice parameter b against various $Ba^{2+}$ concentrations in $NaCa_{2-x}Ba_xGeO_4F$ (x=0.01, 0.015, 0.02, 0.025, 0.035, 0.04, 0.045)
Figure 4C:
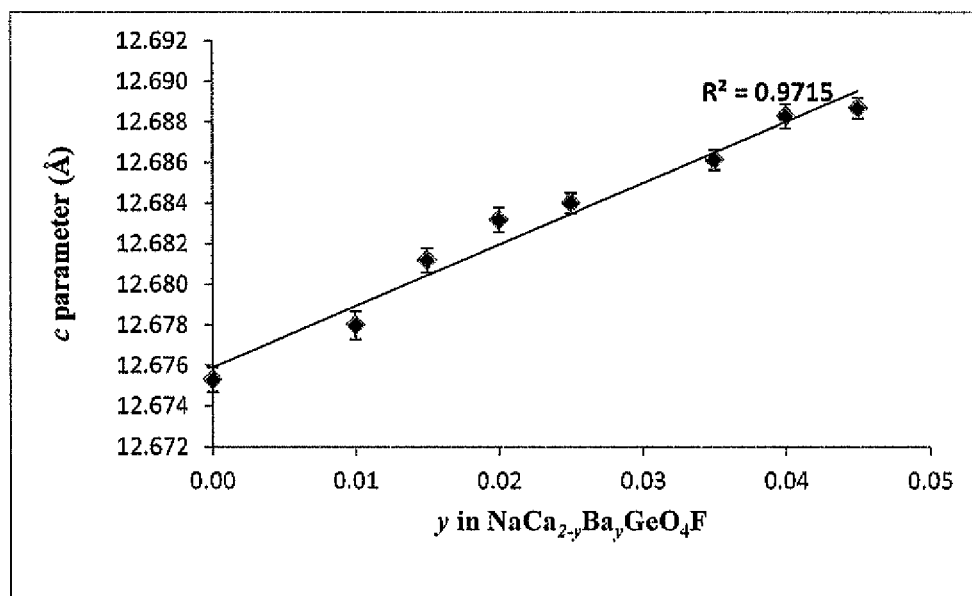
FIG. 4c shows the plot of lattice parameter c against various $Ba^{2+}$ concentrations in $NaCa_{2-x}Ba_xGeO_4F$ (x=0.01, 0.015, 0.02, 0.025, 0.035, 0.04, 0.045)
Figure 4D:
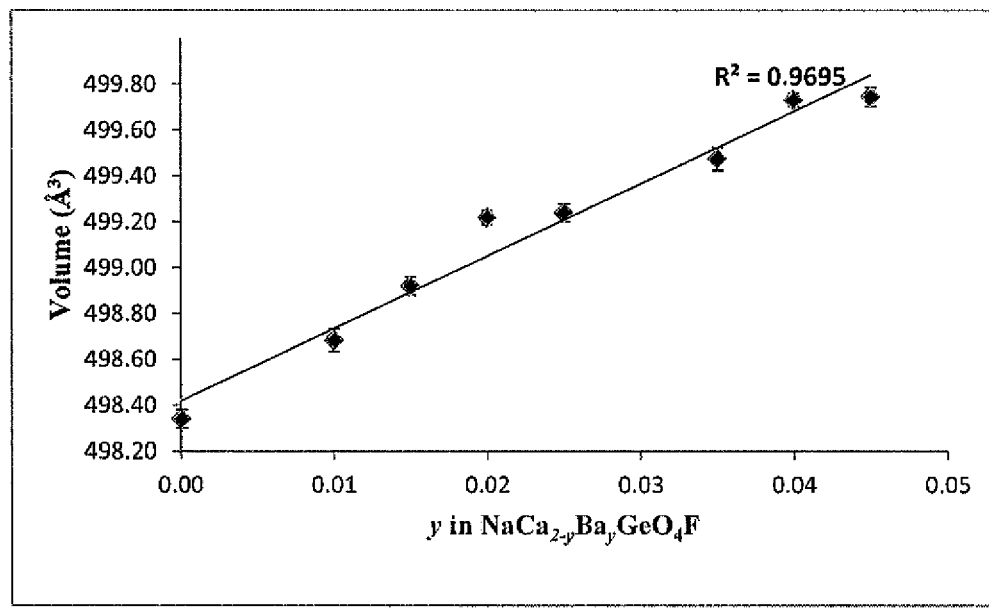
FIG. 4d shows the plot of the unit cell volume against $Ba^{2+}$ concentrations in $NaCa_{2-x}Ba_xGeO_4F$ (x=0.01, 0.015, 0.02, 0.025, 0.035, 0.04, 0.045)
Figure 4E:
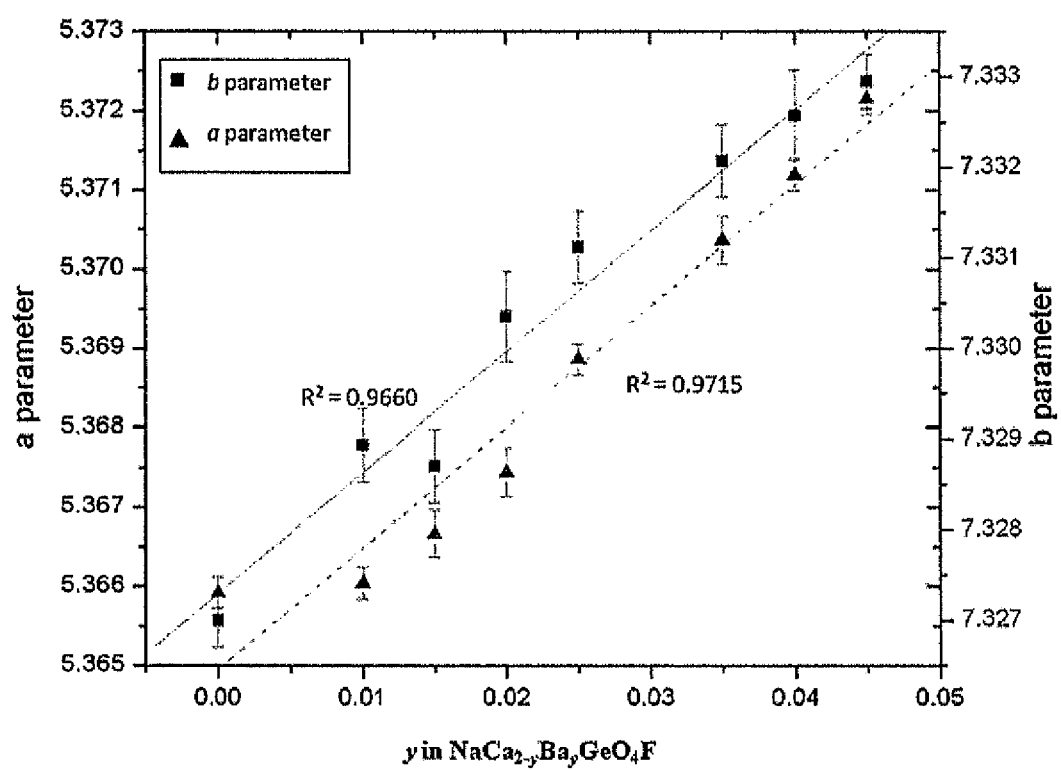
FIG. 4e shows the plot of lattice parameters a and b against various $Ba^{2+}$ concentrations in $NaCa_{2-x}Ba_xGeO_4F$ (x=0.01, 0.015, 0.02, 0.025, 0.035, 0.04, 0.045)
Figure 4F:
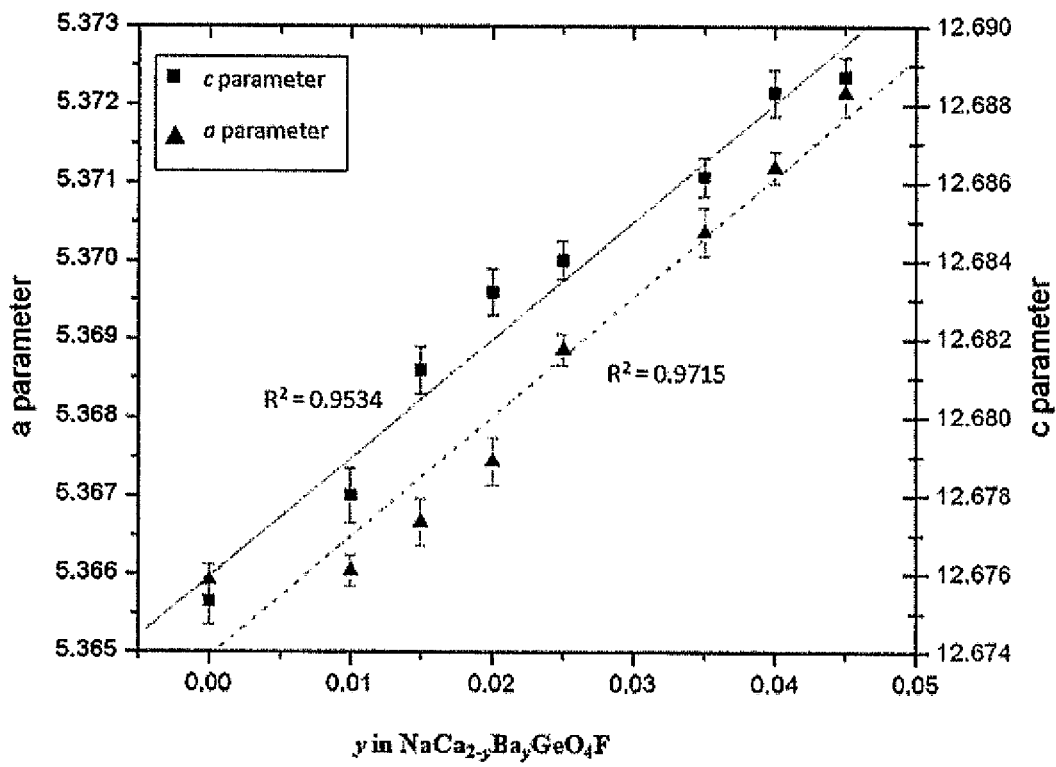
FIG. 4f shows the plot of lattice parameters a and c against various $Ba^{2+}$ concentrations in $NaCa_{2-x}Ba_xGeO_4F$ (x=0.01, 0.015, 0.02, 0.025, 0.035, 0.04, 0.045)

The formal valence of M1 is 1.7 (0.7×2+0.3×1) and the one for M2 is 1.76 (0.73×2+0.27×1). The M1 site has a BVS value of 1.87, and BVS of M2 is 1.91. These two sites can be partially substituted with $Ba^{2+}$ and $Sr^{2+}$. As the $Sr^{2+}$ ion size is smaller (ionic radius 1.44 Å) than the $Ba^{2+}$ ion (ionic radius 1.61 Å), $Sr^{2+}$ can substitute slightly more of $Ca^{2+}$ (ionic radius 1.34 Å) (>0.06 mol %) than $Ba^{2+}$ (<0.05 mol %). The structural properties of materials from the series of $NaCa_{2-x}Ba_xGeO_4F$ (x=0.01, 0.015, 0.02, 0.025, 0.035, 0.04, 0.045) were investigated. At higher concentrations a second phase, hexagonal $Ba_2Ge_5O_{12}$ started to form as an impurity, as shown in the X-ray diffraction pattern (FIGS. 2 and 3).

As seen, there is a shift of the peaks towards lower 2θ angles with increasing barium concentration, indicating a lattice expansion. As the two M (Ca/Na) sites in the structure have the same octahedral coordination environment, the refinements assumed that $Ba^{2+}$ substitutes into the Ca1 and Ca2 sites. The $Ba^{2+}$ ion being larger than the $Ca^{2+}$ ion, the lattice parameters of the $Ba^{2+}$ substituted material increase with higher $Ba^{2+}$ concentrations as shown in Table 2. The bond distances for different $Ba^{2+}$ concentrations were calculated.

TABLE 2

Lattice parameters of various $Ba^{2+}$ substituted materials in the series $NaCa_{2-x}Ba_xGeO_4F$

| Ba_mol % | a (Å) | b (Å) | c (Å) | V (Å³) |
|---|---|---|---|---|
| 0.010 | 5.3666(2) | 7.3287(4) | 12.6852(7) | 498.92(5) |
| 0.015 | 5.3667(2) | 7.3289(4) | 12.6854(8) | 498.94(3) |
| 0.020 | 5.3678(3) | 7.3320(3) | 12.6864(6) | 499.29(4) |
| 0.025 | 5.3689(2) | 7.3312(4) | 12.6880(5) | 499.34(6) |
| 0.035 | 5.3704(3) | 7.3321(2) | 12.6892(6) | 499.48(5) |
| 0.040 | 5.3712(2) | 7.3326(3) | 12.6883(5) | 499.73(4) |
| 0.045 | 5.3731(2) | 7.3330(3) | 12.6887(6) | 499.75(3) |

The plot of the lattice parameters and unit cell volumes versus $Ba^{2+}$ concentrations indicate an almost linear behavior (FIG. 4). Our refinements indicate that $Ba^{2+}$ is gradually substituting $Ca^{2+}$ in the M1 and M2 sites. The changing bond lengths and bond angles for the $NaCa_{2-x}Ba_xGeO_4F$ series are shown in Table 3. The BVS values for the atoms in the $NaCa_{2-x}Ba_xGeO_4F$ structures are listed in Table 4. The very small change in the BVS value for the M1 and M2 site with increasing $Ba^{2+}$ mol %, indicate that the substitution of $Ca^{2+}$ by a very low concentration of $Ba^{2+}$ does not significantly affect the BVS values.

TABLE 3

Bond distances and selected bond angles of $NaCa_{2-x}Ba_xGeO_4F$
$NaCa_{2-x}Ba_xGeO_4F$

| | | x = 0.01 | 0.015 | 0.02 | 0.025 | 0.035 | 0.04 | 0.045 |
|---|---|---|---|---|---|---|---|---|
| Ge1- | O1 | 1.795(2) | 1.803(4) | 1.800(2) | 1.834(7) | 1.821(2) | 1.837(7) | 1.862(4) |
| | O2 × 2 | 1.794(3) | 1.799(5) | 1.808(4) | 1.803(2) | 1.813(4) | 1.824(5) | 1.825(3) |
| | O3 | 1.780(3) | 1.807(4) | 1.815(8) | 1.817(6) | 1.827(7) | 1.850(7) | 1.859(4) |
| O1--Ge1--O2 | | 107.5(4) | 106.5(3) | 104.6(7) | 106.2(5) | 107.2(5) | 106.1(2) | 106.0(1) |
| O1--Ge1--O3 | | 112.3(3) | 111.5(4) | 113.2(3) | 110.6(4) | 112.0(3) | 111.3(4) | 111.1(3) |
| M1- | O1 | 2.199(4) | 2.246(5) | 2.277(3) | 2.265(3) | 2.280(6) | 2.284(6) | 2.329(7) |
| | O2 | 2.386(3) | 2.403(3) | 2.393(3) | 2.414(5) | 2.434(4) | 2.422(5) | 2.483(3) |
| | O2 | 2.265(4) | 2.298(8) | 2.330(5) | 2.335(6) | 2.361(4) | 2.362(6) | 2.425(6) |
| | O3 | 2.190(5) | 2.289(3) | 2.337(5) | 2.316(4) | 2.190(5) | 2.424(3) | 2.362(7) |
| | F | 2.421(3) | 2.424(2) | 2.429(3) | 2.437(3) | 2.438(5) | 2.452(2) | 2.470(4) |
| | F | 2.427(5) | 2.439(6) | 2.447(3) | 2.500(4) | 2.475(2) | 2.468(4) | 2.482(6) |
| M2- | O1 | 2.207(7) | 2.278(6) | 2.324(4) | 2.341(4) | 2.347(5) | 2.378(7) | 2.380(6) |
| | O2 × 2 | 2.194(8) | 2.265(9) | 2.305(5) | 2.299(4) | 2.308(5) | 2.320(6) | 2.345(8) |
| | O3 | 2.259(3) | 2.302(5) | 2.319(2) | 2.327(4) | 2.357(3) | 2.382(3) | 2.392(5) |
| | F | 2.324(6) | 2.325(3) | 2.331(4) | 2.326(8) | 2.341(7) | 2.354(3) | 2.350(6) |
| | F | 2.514(4) | 2.538(7) | 2.549(4) | 2.556(4) | 2.561(4) | 2.566(8) | 2.569(4) |

TABLE 4

Bond Valence Sum (BVS)s for all the atoms in various $NaCa_{2-x}Ba_xGeO_4F$ compounds

| | Ba mol % | | | | | | | |
|---|---|---|---|---|---|---|---|---|
| Atoms | 0.00 | 0.01 | 0.015 | 0.02 | 0.025 | 0.035 | 0.04 | 0.045 |
| Ge | 3.67 | 3.63 | 3.71 | 3.68 | 3.66 | 3.72 | 3.67 | 3.61 |
| M1 | 1.87 | 1.84 | 1.83 | 1.83 | 1.82 | 1.81 | 1.82 | 1.81 |
| M2 | 1.91 | 1.90 | 1.90 | 1.89 | 1.88 | 1.86 | 1.86 | 1.84 |
| F | 1.27 | 1.26 | 1.24 | 1.23 | 1.20 | 1.22 | 1.22 | 1.20 |
| O1 | 2.30 | 2.27 | 2.35 | 2.23 | 2.22 | 2.21 | 2.15 | 2.11 |
| O2 | 2.13 | 2.11 | 2.16 | 2.12 | 2.07 | 1.99 | 2.01 | 1.94 |
| O3 | 2.09 | 2.11 | 2.13 | 2.04 | 2.15 | 2.18 | 2.2 | 2.05 |

Figure 5A:
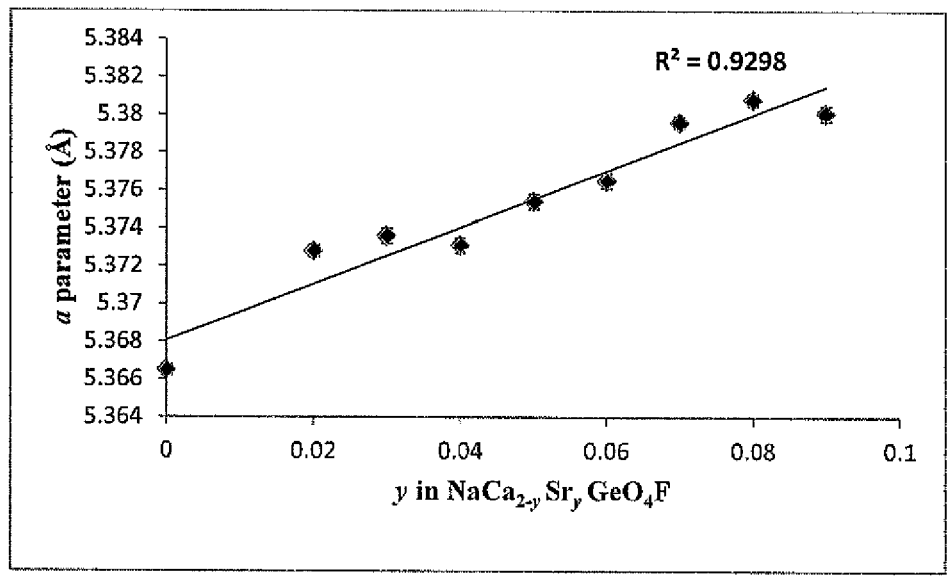
FIG. 5a shows a plot of lattice parameter a against y in $NaCa_{2-y}Sr_yGeO_4F$.
Figure 5B:
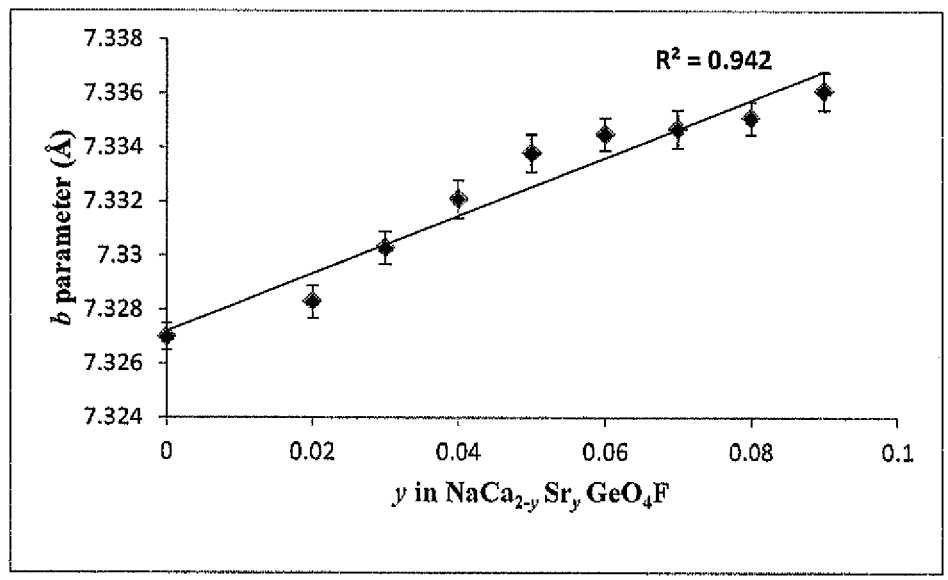
FIG. 5b shows a plot of lattice parameter b against y in $NaCa_{2-y}Sr_yGeO_4F$.
Figure 5C:
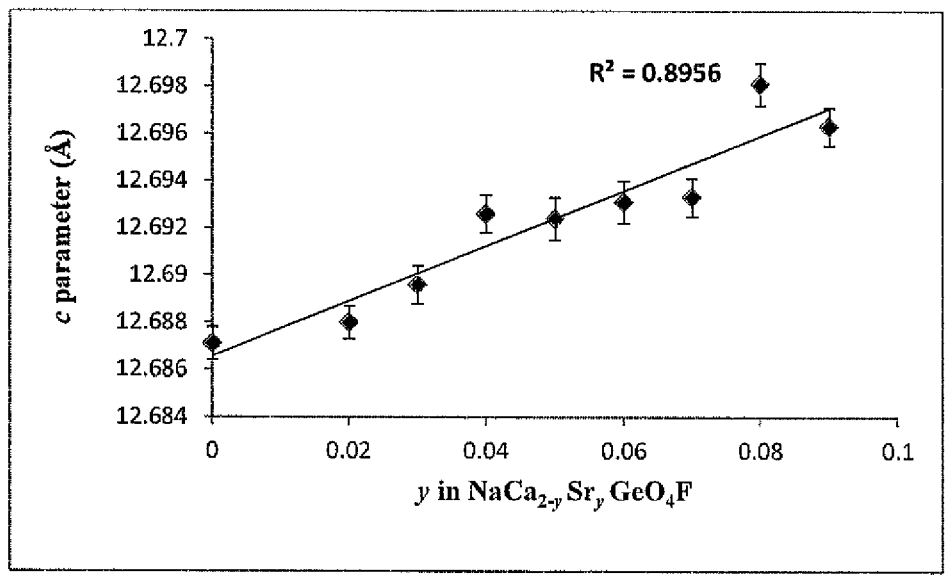
FIG. 5c shows a plot of lattice parameter c against y in $NaCa_{2-y}Sr_yGeO_4F$.

The changing lattice parameter values with varied $Sr^{2+}$ concentration are listed in Table 5. The plots of lattice parameter values against increasing $Sr^{2+}$ concentration are shown if FIG. 5.

TABLE 5

Lattice parameters of various $Sr^{2+}$ substituted materials in the series $NaCa_{2-x}Sr_xGeO_4F$

| Sr mol % | a | b | c | V |
|---|---|---|---|---|
| 0.00 | 5.3665(3) | 7.3270(5) | 12.6871(7) | 498.72(8) |
| 0.02 | 5.3728(3) | 7.3283(6) | 12.6880(6) | 499.82(12) |
| 0.03 | 5.3736(4) | 7.3303(6) | 12.6896(8) | 499.85(10) |
| 0.04 | 5.3731(4) | 7.3321(7) | 12.6926(8) | 500.37(11) |
| 0.05 | 5.3754(4) | 7.3338(7) | 12.6924(9) | 500.12(9) |
| 0.06 | 5.37659(3) | 7.3345(6) | 12.6931(9) | 500.48(9) |
| 0.07 | 5.3796(3) | 7.3347(7) | 12.6933(8) | 500.81(10) |
| 0.08 | 5.3808(3) | 7.3351(6) | 12.6981(9) | 500.94(12) |
| 0.09 | 5.3801(4) | 7.3361(7) | 12.6963(8) | 501.12(9) |

Photoluminescence of the Undoped $NaCa_2GeO_4F$ and $NaCa_{2-x}Ba_xGeO_4F$ (x=0.01, 0.015, 0.02, 0.025, 0.035, 0.04, 0.045)

Figure 6:
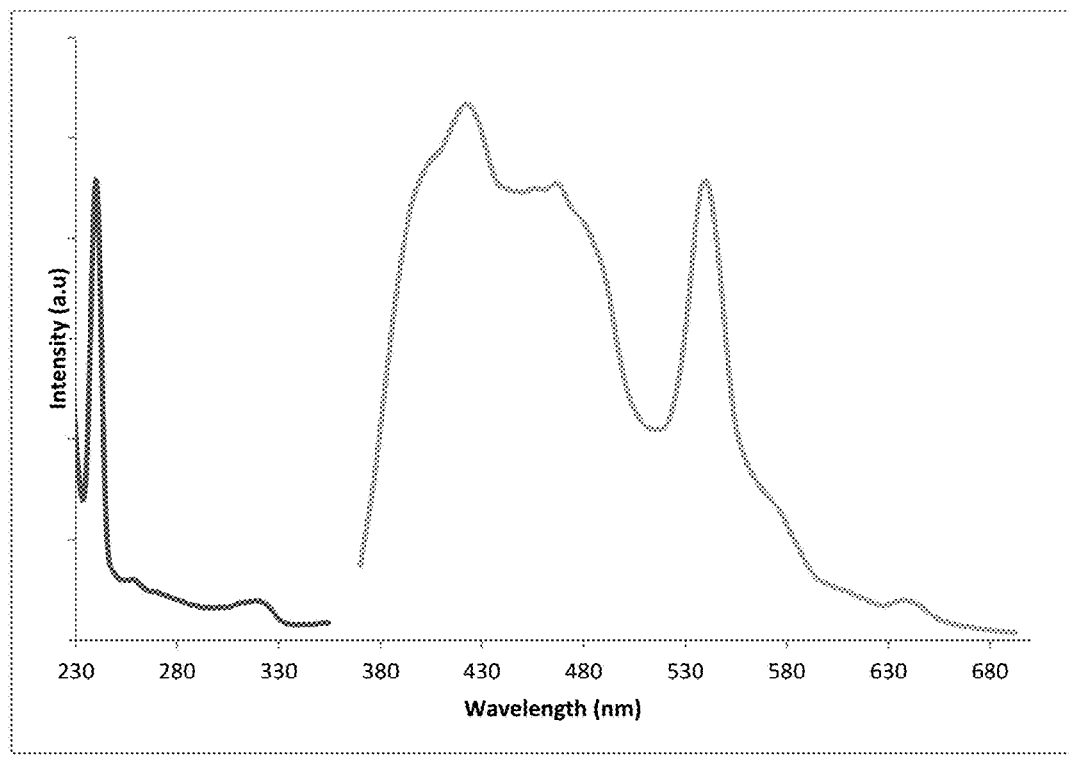
FIG. 6 shows the emission and excitation spectra of $NaCa_2GeO_4F$ at 254 nm excitation and 422 nm emission.

FIG. 6 shows the excitation and emission spectra of undoped $NaCa_2GeO_4F$ when excited with light at a wavelength of 240 nm. The undoped oxyfluoride material shows peaks at 422 nm, 468 nm and 540 nm which can be assigned to a oxygen deficient $GeO_4$ unit.

Figure 7:
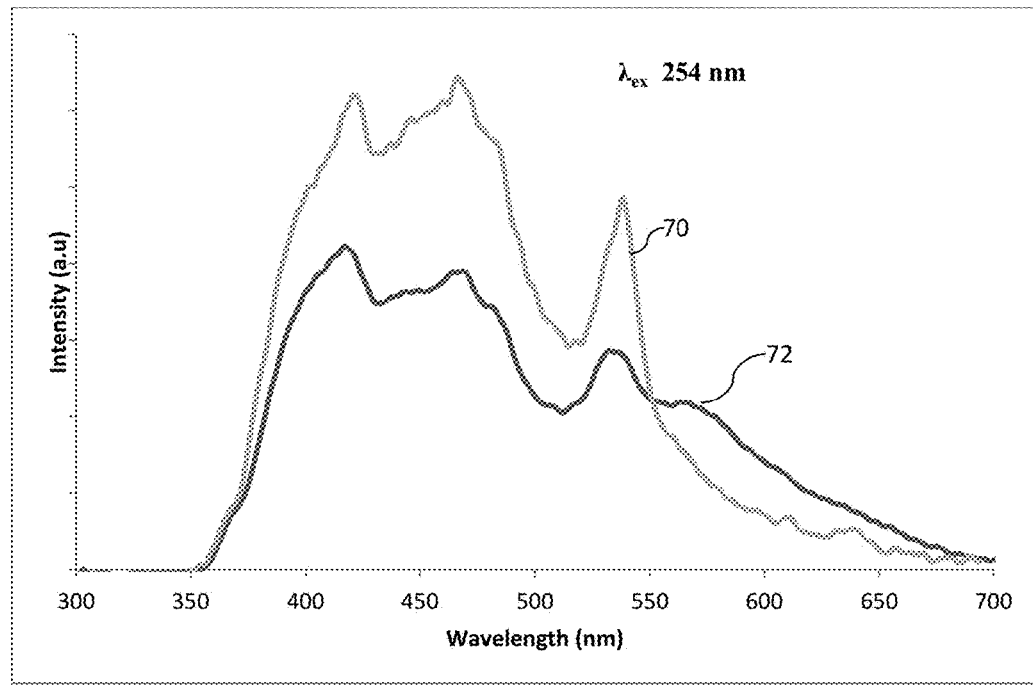
FIG. 7 shows the emission spectra of $NaCa_{1.985}Ba_{0.015}GeO_4F$ (72) and $NaCa_2GeO_4F$ (70) under 254 nm excitation.
Figure 8:
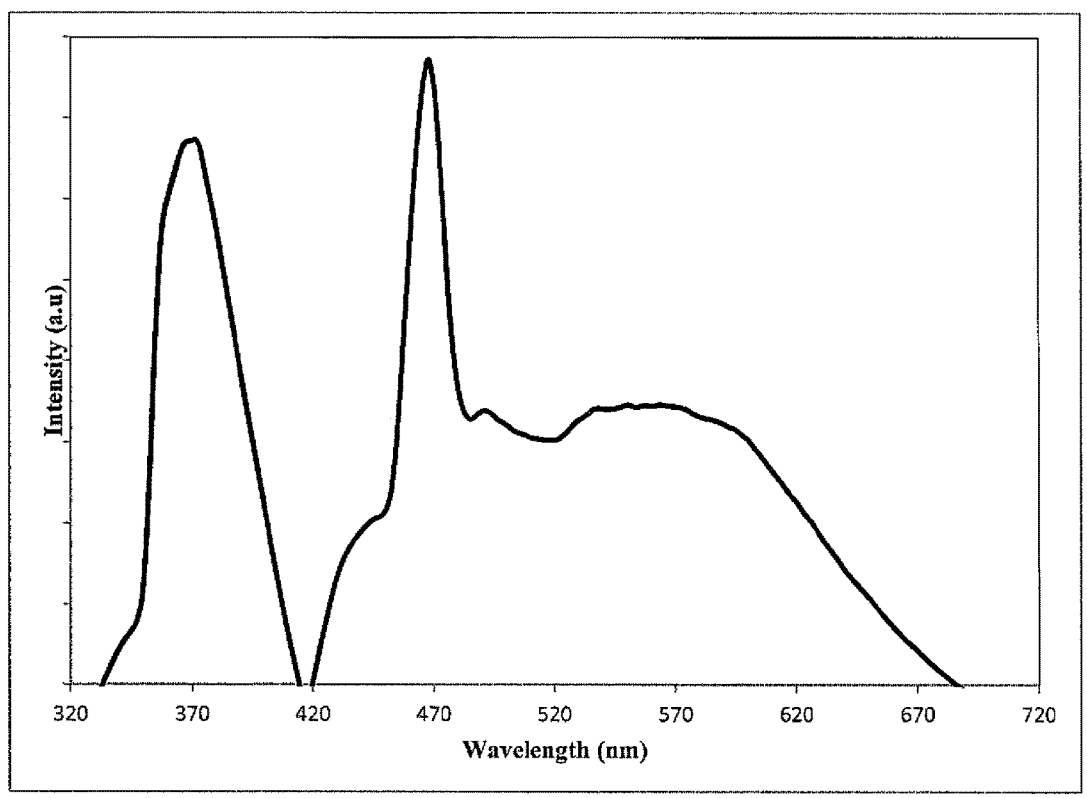
FIG. 8 shows the emission spectra of $NaCa_{1.985}Ba_{0.02}GeO_4F$ under 365 nm excitation.

Compounds in the $NaCa_{2-x}Ba_xGeO_4F$ family prepared under reducing condition are self-activating and show faint yellow luminescence under UV light. A comparison of the emission spectra for $NaCa_2GeO_4F$ and $NaCa_{1.985}Ba_{0.015}GeO_4F$ at 254 nm excitation is shown in FIG. 7. $NaCa_{1.985}Ba_{0.015}GeO_4F$ exhibits a broad emission in 560-600 nm region. The emission spectra of $NaCa_{1.985}Ba_{0.015}GeO_4F$ at 365 nm excitation (FIG. 8) shows sharp peak at 464 nm and a broad peak in the 540 to 600 nm range. $NaCa_{2-x}Ba_xGeO_4F$ (x=0.01 to 0.045) can be used as yellow emitting phosphor when excited in the near UV region.

Photoluminescent Properties of $Ce^{3+}$ Doped $Na_{1+x}Ca_{2-2x}Ce_xGeO_4F$ (x=0.01 to 0.07)

Figure 9:
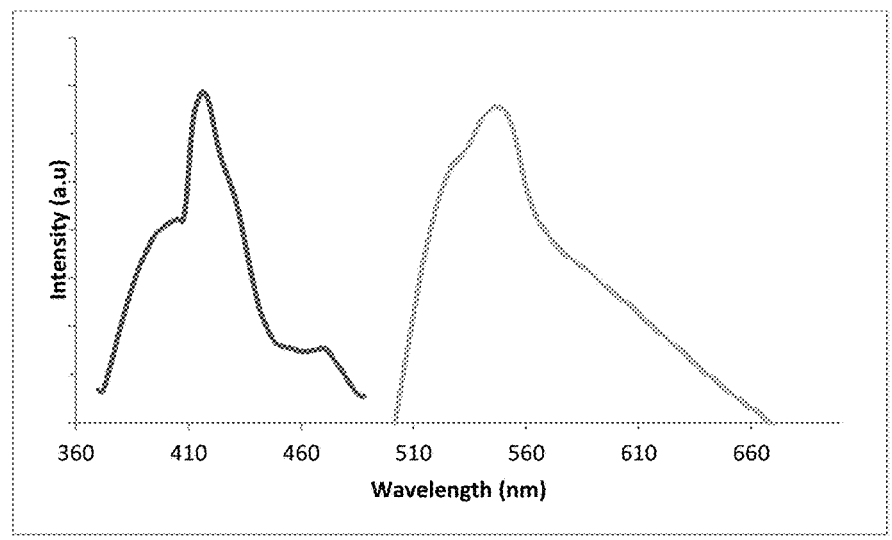
FIG. 9 shows excitation and emission spectra of $Na_{1.01}Ca_{1.98}Ce_{0.01}GeO_4F$ at 415 nm excitation and 555 nm emission.

Photoluminescence measurement for $Ce^{3+}$ doped $Na_{1+x}Ca_{2-2x}Ce_xGeO_4F$ (x=0.01, 0.02, 0.03, 0.04, 0.05, 0.06, 0.07) carried out at room temperature show blue-green luminescence when excited with longer wavelength UV light due to electronic transitions from the 5d to 4f ($^2F_{5/2}$ and $^2F_{7/2}$) states of $Ce^{3+}$. The excitation spectra of $Na_{1+x}Ca_{2-2x}Ce_xGeO_4F$ (x=0.01) reveals photoluminescent peaks at 415 nm, 430 and 465 nm at an emission wavelength of 555 nm (FIG. 9). This material behaves very similar to $Sr_{2-2x}Ce_xNa_xAlO_4F$ as was observed by Chen et. al. which shows a blue green emission when excited at 405 nm.[11]

Figure 10A:
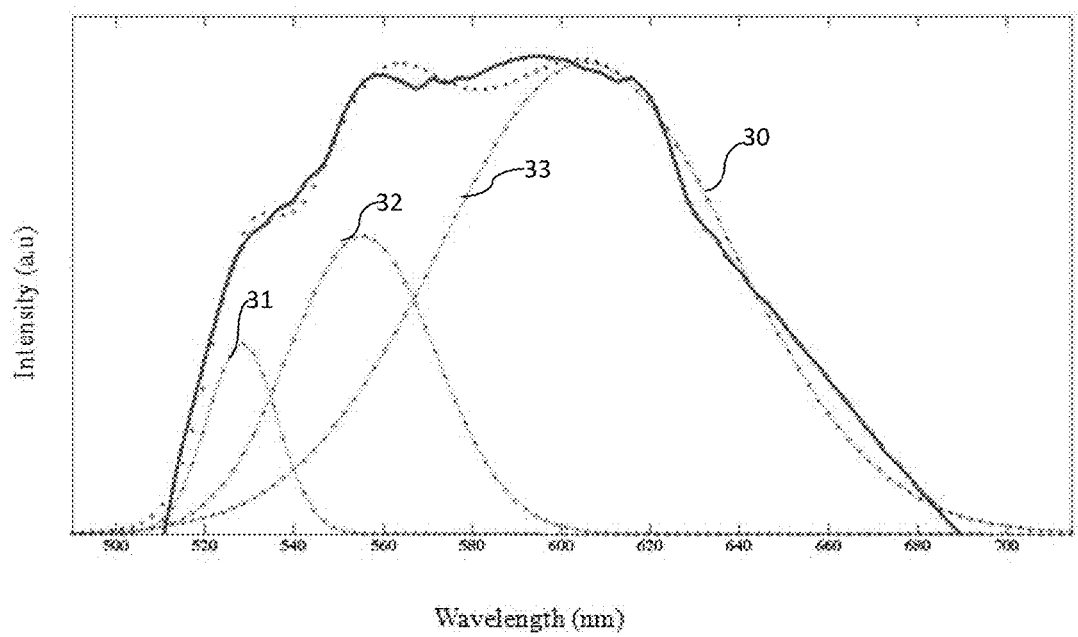
FIG. 10a shows the Gaussian fitted emission spectra (30) of $Na_{1.02}Ca_{1.98}Ce_{0.02}GeO_4F$ at 465 nm excitation and three Gaussian components (31, 32, 33)
Figure 10B:
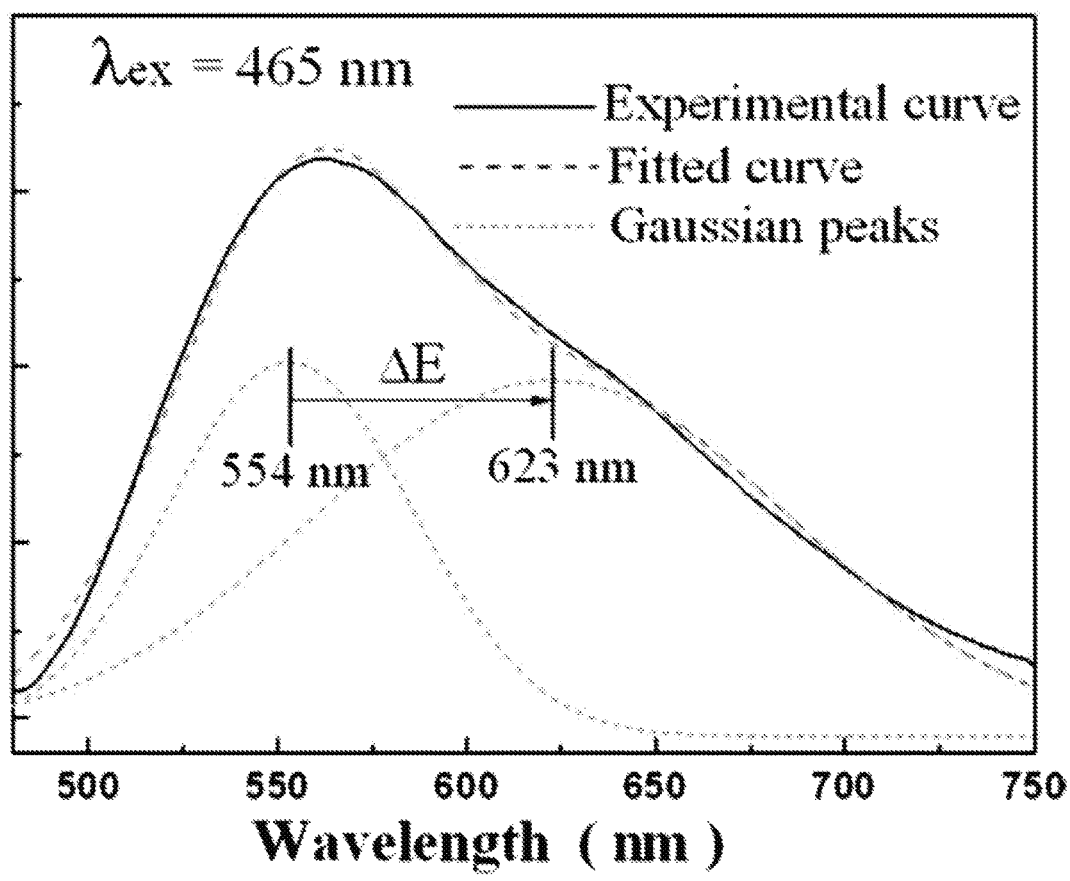
FIG. 10b shows the Gaussian-fitted emission spectra of $Ca_2GeO_4:Ce^{3+},Li^+$ and its two Gaussian components.

As $NaCa_2GeO_4F$ is chemically more stable than any of the $Sr_{3-x}A_xMO_4F$ (A=Ca, Ba and M=Al, Ga) materials and furthermore, $NaCa_{2-2x}Ce_xGeO_4F$ shows an excitation spectrum above 400 nm, this material has potential applications as a phosphor for $In_{1-x}Ga_xN$ blue light emitting (390 nm to 470 nm) device. Compared to $Ca_2GeO_4:Ce^{3+},Li^+$, this compound exhibits two emission peaks at 560 and 625 nm under 465 nm excitation (FIG. 10).[29] The two distinct emission peaks are attributed to the fact that $Ce^{3+}$ ions occupying two distinct M sites.

Figure 11A:
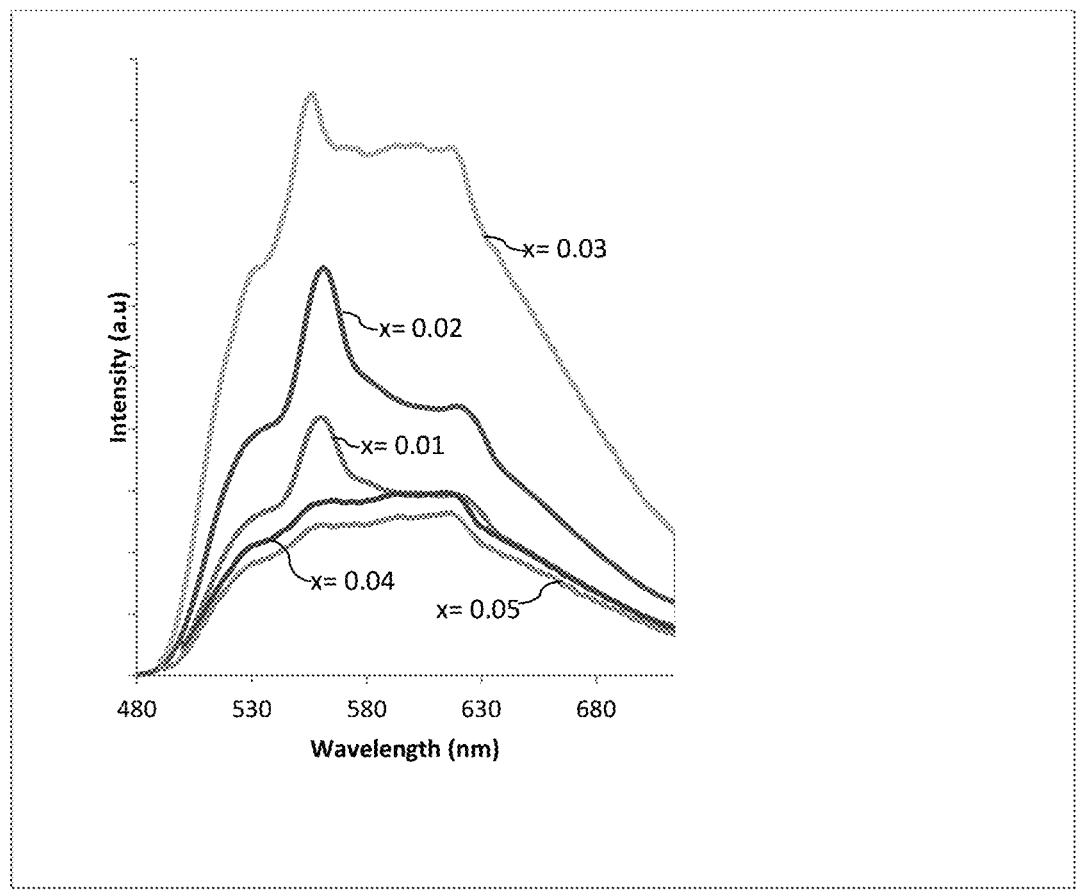
FIG. 11 shows (a) Plot of emission spectra of $Na_{1+x}Ca_{2-2x}Ce_xGeO_4F$ (x=0.01, 0.02, 0.03, 0.04, 0.05) at 465 nm excitation and (b) Emission spectra of $Na_{1+x}Ca_{2-2x}Ce_xGeO_4F$ (x=0.01, 0.02, 0.03, 0.04, 0.05, 0.06, 0.07) at 430 nm excitation.
Figure 11B:
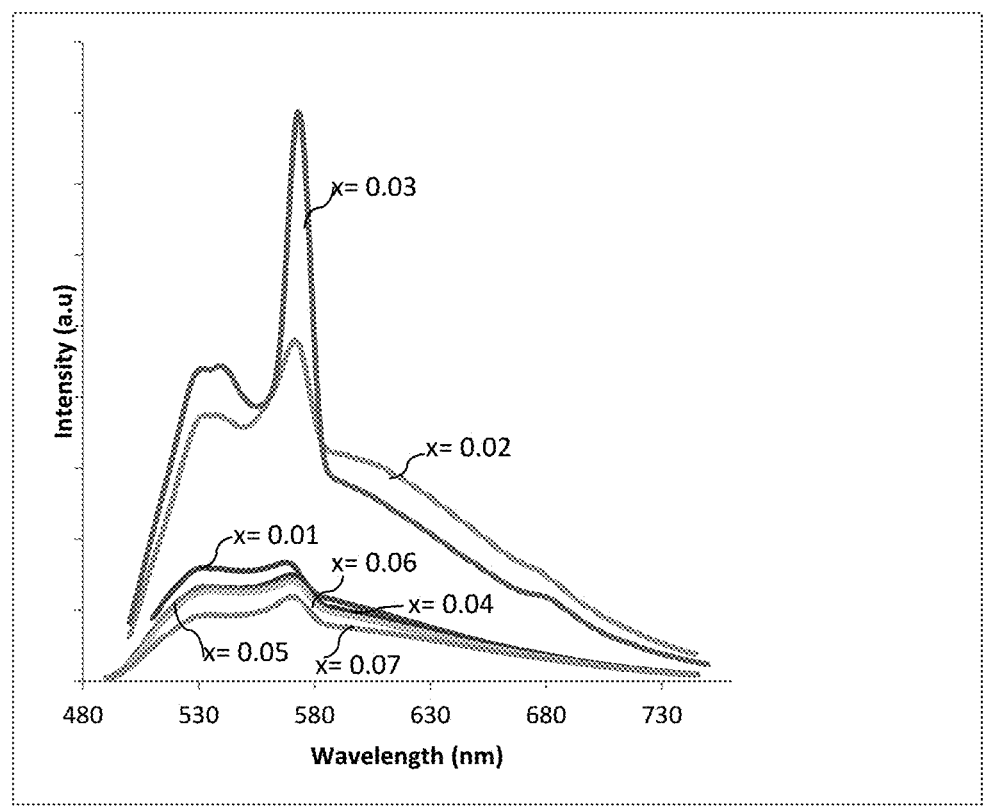

The emission spectra of $Ce^{3+}$ doped $NaCa_{2-2x}Ce_xGeO_4F$ (x=0.01, 0.02, 0.03, 0.04, 0.05) at 465 nm and at 430 nm excitation shows peaks near 550 nm and 625 nm with the strongest photoluminescence measured for $Na_{1.03}Ca_{1.94}Ce_{0.03}GeO_4F$, indicating concentration quenching at $Ce^{3+}$ concentrations above 0.03 mol % (FIG. 11).

Figure 12:
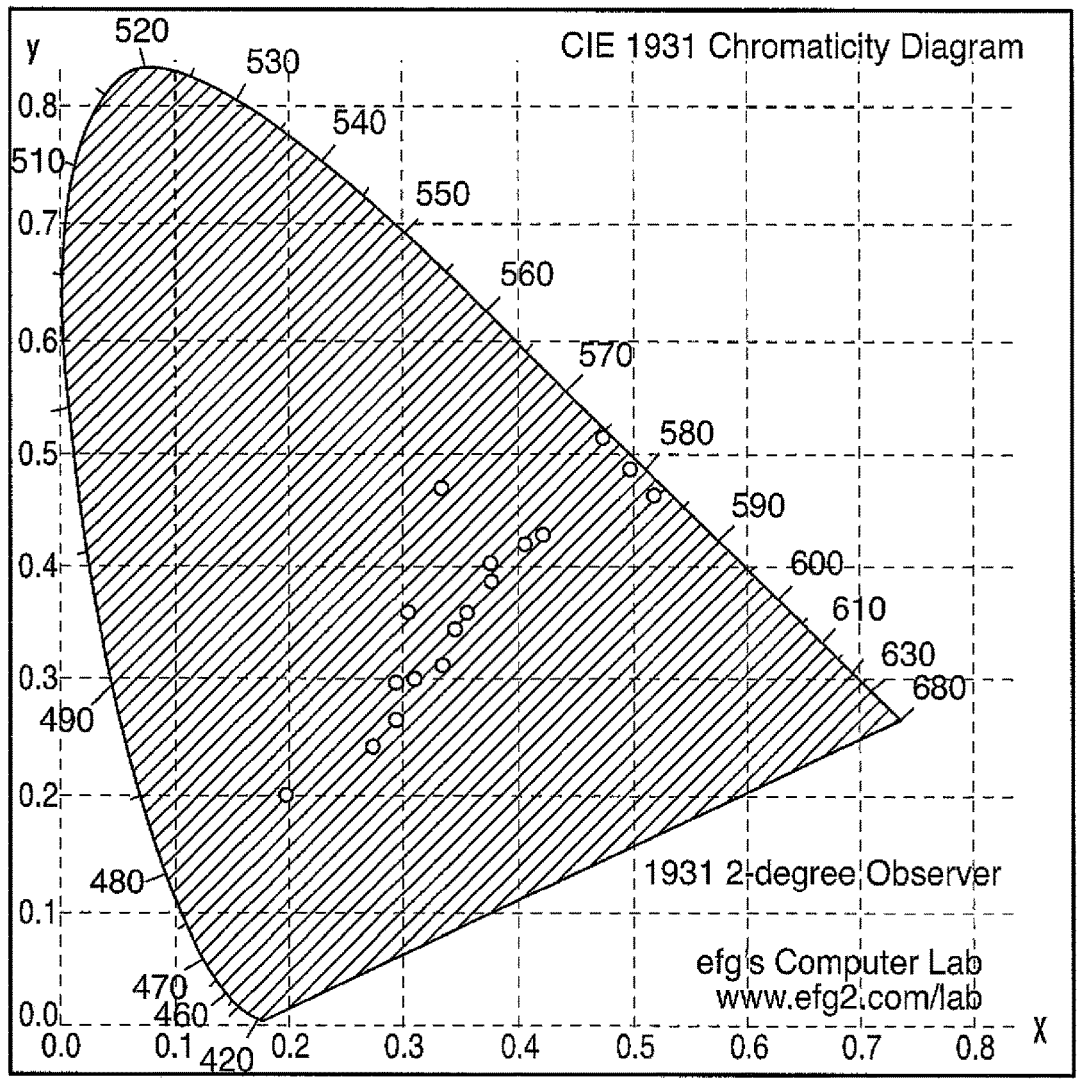
FIG. 12 shows a CIE chromaticity diagram showing the corresponding CIE coordinates for various phosphors studied.

The CIE coordinate values for different rare earth dopants ($Ce^{3+}$, $Eu^{3+}$, $Eu^{2+}$, $Tb^{3+}$) and $Ba^{2+}$ substituted $NaCa_2GeO_4F$ samples are listed in Table 6 and the corresponding CIE values are plotted in a CIE diagram (FIG. 12).

TABLE 6 the corresponding chromaticity Commission International de l'Eclairage (CIE) coordinates of the $NaCa_2GeO_4F$-based phosphors

| Luminescent materials | CIE values x | y |
|---|---|---|
| Green | | |
| 1. $NaCa_{1.96}Ce_{0.02}GeO_4F$ (Ex 365 nm) | 0.3763 | 0.4231 |
| 2. $NaCa_{1.97}Ba_{0.01}Eu_{0.01}GeO_4F$ (Ex 378 nm) | 0.3565 | 0.4183 |
| 3. $NaCa_{1.94}Ba_{0.02}Eu_{0.02}GeO_4F$ (Ex 365 nm) | 0.3808 | 0.4269 |
| 4. $NaCa_{1.93}Tb_{0.07}Ge_{0.93}Al_{0.07}O_4F$ (Ex 254 nm) | 0.2612 | 0.3991 |
| Blue-green | | |
| 5. $NaCa_{1.95}Ba_{0.01}Ce_{0.02}GeO_4F$ (Ex 365 nm) | 0.3211 | 0.3846 |
| 6. $NaCa_{1.94}Ba_{0.02}Ce_{0.02}GeO_4F$ (Ex 365 nm) | 0.2736 | 0.3004 |
| 7. $NaCa_{1.92}Tb_{0.03}Ce_{0.02}GeO_4F$ (Ex 254 nm) | 0.2306 | 0.2997 |
| 8. $NaCa_{1.97}Tb_{0.01}Ce_{0.01}GeO_4F$ (Ex 254 nm) | 0.2609 | 0.3506 |
| Blue | | |
| 9. $NaCa_2GeO_4F$ (Ex 254 nm) | 0.2021 | 0.2492 |
| 10. $NaCa_{1.985}Ba_{0.015}GeO_4F$ (Ex 254 nm) | 0.2503 | 0.2741 |
| 11. $NaCa_{1.98}Ba_{0.02}GeO_4F$ (Ex 254 nm) | 0.2088 | 0.2735 |
| 12. $NaCa_{1.955}Ba_{0.045}GeO_4F$ (Ex 254 nm) | 0.2067 | 0.2561 |
| White | | |
| 13. $NaCa_2GeO_4F$ (Ex 365 nm) | 0.3075 | 0.3403 |
| 14. $NaCa_{1.98}Ba_{0.02}GeO_4F$ (Ex 365 nm) | 0.3122 | 0.3435 |
| 15. $NaCa_{1.97}Ba_{0.01}Eu_{0.01}GeO_4F$ (Ex 254 nm) | 0.3035 | 0.2992 |
| Red | | |
| 16. $NaCa_{1.94}Ba_{0.02}Eu_{0.02}GeO_4F$ (Ex 420 nm) | 0.4753 | 0.5119 |
| 17. $NaCa_{1.9}Eu_{0.05}GeO_4F$ (Ex 260 nm) | 0.5097 | 0.4657 |
| 18. $NaCa_{1.8}Mn_{0.1}Ce_{0.04}GeO_4F$ (Ex 254 nm) | 0.4917 | 0.4775 |

Photoluminescent Characterization of $Na_{1.05}Ca_{1.9}Eu_{0.05}GeO_4F$

Figure 13:
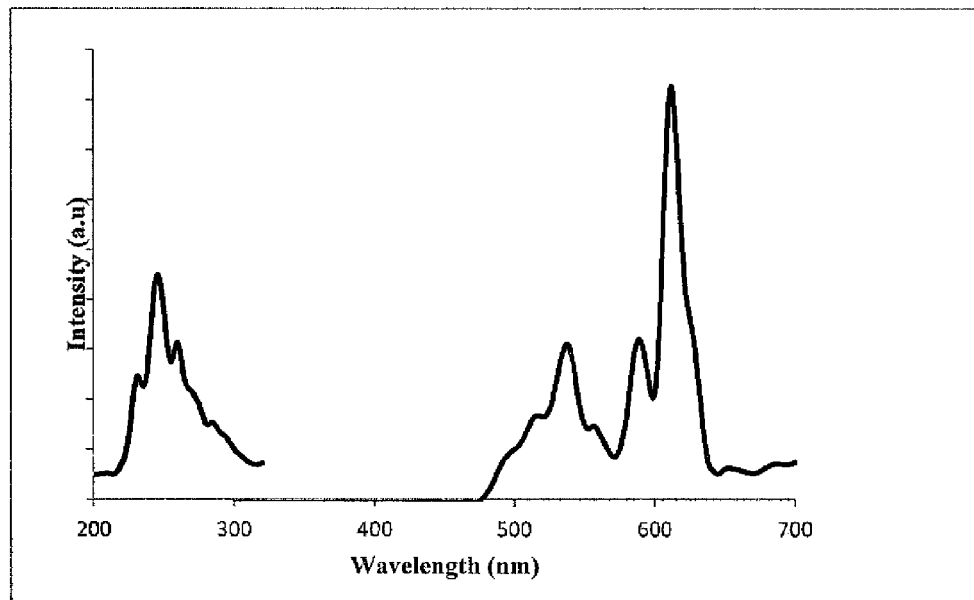
FIG. 13 shows excitation and emission spectra of $Na_{1.05}Ca_{1.9}Eu_{0.05}GeO_4F$ at 260 nm excitation.

The excitation and emission spectra of $Na_{1.05}Ca_{1.9}Eu_{0.05}GeO_4F$ at 260 nm excitation is shown in FIG. 13. The bright red luminescence occurs due to the peaks at 540, 588, 610 nm originating from the $^5D_0 \rightarrow ^7F_J$ (J=0, 1, 2, 3, 4) transitions along with relatively weak peaks at about 535 nm due to the $^5D_1 \rightarrow ^7F_1$ transition of $Eu^{3+}$.

Figure 14:
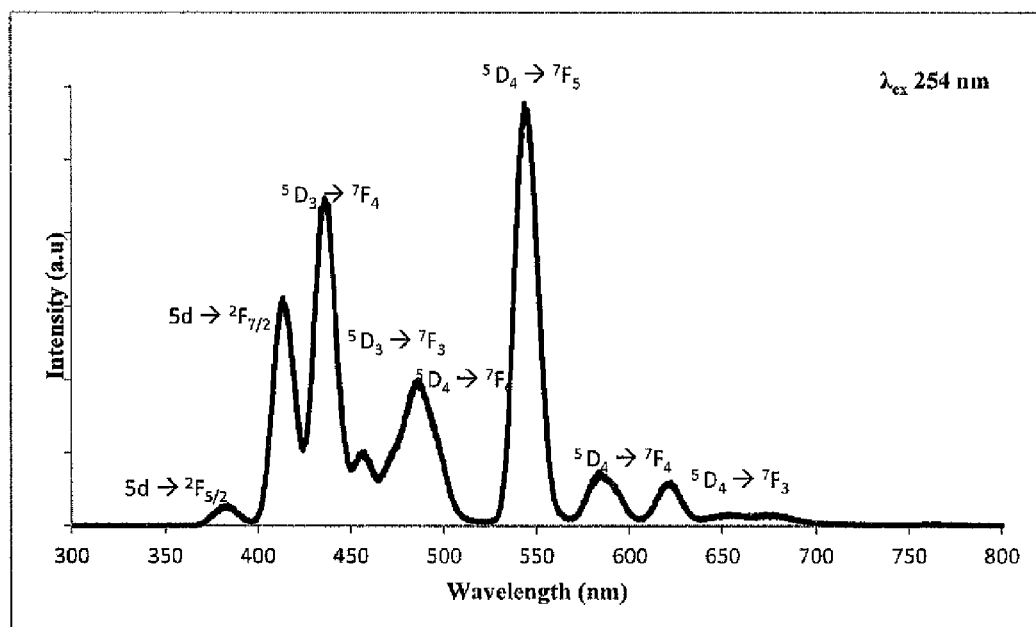
FIG. 14 shows emission spectra of $NaCa_{1.9}Li_{0.05}Tb_{0.03}Ce_{0.02}GeO_4F$, at 254 nm excitation.
Figure 15:
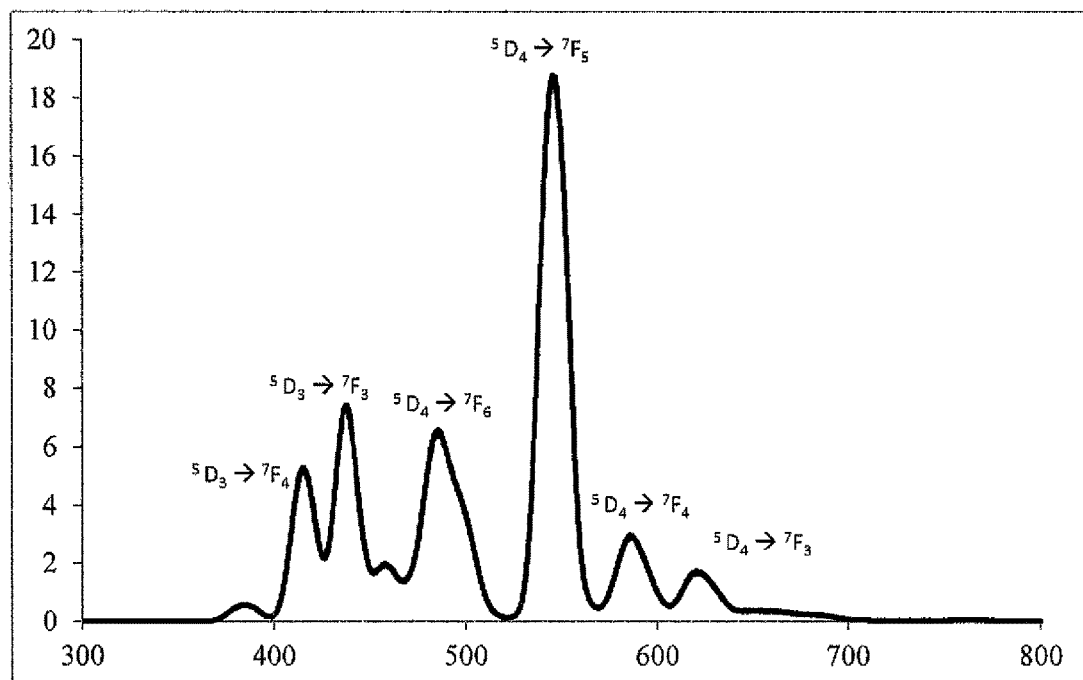
FIG. 15 shows emission spectra of NaCa1.93Tb0.07Ge0.93Al0.07O4F at 254 nm excitation.

Photoluminescent characterization of $NaCa_{2-2x}Li_xTb_xGeO_4F$, $NaCa_{1.93}Tb_{0.07}Ge_{0.93}Al_{0.07}O_4F$, and $Na_{1.07}Ca_{1.86}Tb_{0.07}GeO_4F$ We observed that $NaLi_{0.05}Ca_{1.9}Tb_{0.03}Ce_{0.02}GeO_4F$ exhibits a bright green emission under 254 nm UV light (FIG. 14). The emission spectra shows peaks at 383 nm and 413 nm due to 5d to $^2F_{5/2}$ and $^2F_{7/2}$ transitions of the $Ce^{3+}$ ion and peaks at 435, 455, 484, 545, 584 and 625 nm due to the $^5D_3 \rightarrow ^7F_4$, $^5D_3 \rightarrow ^7F_3$, $^5D_4 \rightarrow ^7F_6$, $^5D_4 \rightarrow ^7F_5$, $^5D_4 \rightarrow ^7F_4$ and $^5D_4 \rightarrow ^7F_3$ transitions of the $Tb^{3+}$ ions under 254 nm excitation. As the radius of $Tb^{3+}$ ion (92.3 pm) is close to that of the $Ca^{2+}$ ion (99 pm), the $Tb^{3+}$ ions can easily substitute for the $Ca^{2+}$ ion. $Ge^{4+}$ was substituted with $Al^{3+}$ to compare with $Ca_{1.93}Tb_{0.07}Al_{0.07}Ge_{0.93}O_4$.[36] This led to an increase in intensity of the green luminescence. When $Al^{3+}$ was substituted in the $Tb^{3+}$ doped $NaCa_2GeO_4F$, e.g. $NaCa_{1.93}Tb_{0.07}Ge_{0.93}Al_{0.07}O_4F$ shows a very strong green luminescence compared to the one observed $NaCa_{1.9}Li_{0.05}Tb_{0.03}Ce_{0.02}GeO_4F_5$ (FIG. 14). This material can be used as a suitable green emitting phosphor.

Figure 16:
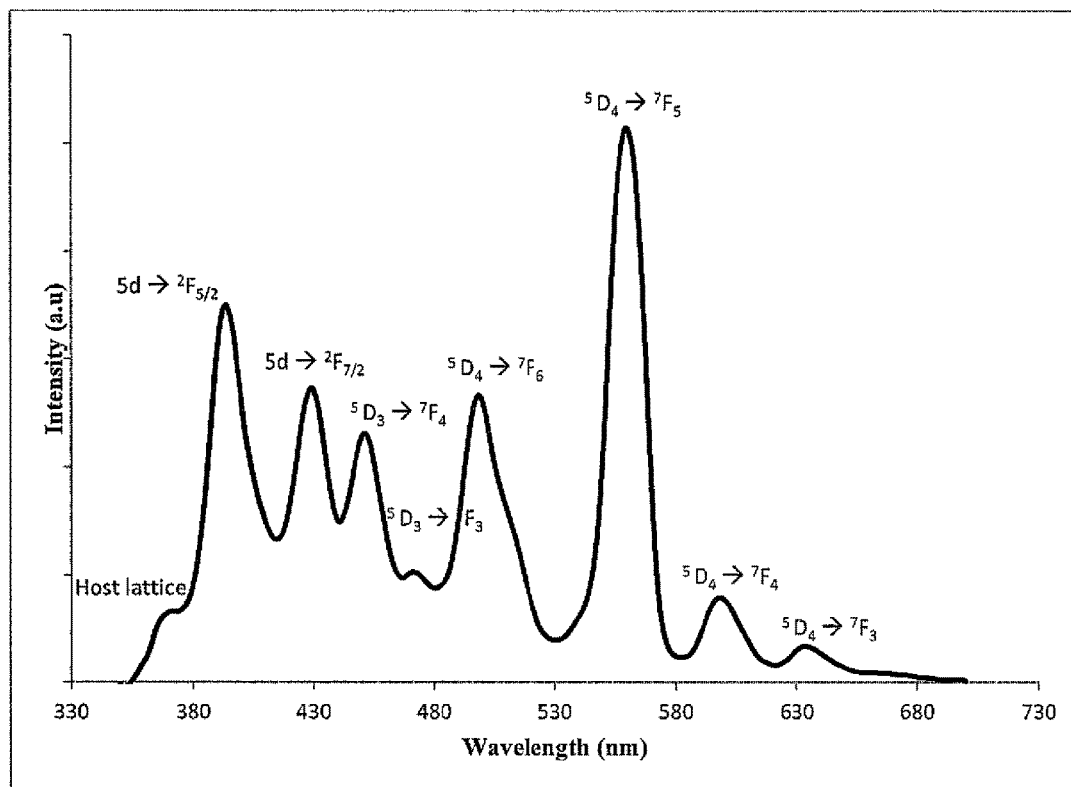
FIG. 16 shows Emission spectra of Na1.07Ca1.86Tb0.07GeO4F at 270 nm excitation.

$Na_{1.07}Ca_{1.86}Tb_{0.07}GeO_4F$ shows green luminescence under UV light. The emission spectrum of $Na_{1.07}Ca_{1.86}Tb_{0.07}GeO_4F$ at 270 nm excitation is plotted in FIG. 16.

Photoluminescence of $Mn^{2+}$ Substituted $Na_{1.04}Ca_{1.8}Mn_{0.1}Ce_{0.04}GeO_4F$ $Mn^{2+}$ substituted $Na_{1.04}Ca_{1.8}Mn_{0.1}Ce_{0.04}GeO_4F$ gives a bright yellow luminescence under 220 nm and 365 nm UV light. This material can be used as a yellow emitting phosphor for CFLs and near-UV LEDs as combination of yellow and blue light gives cold white light.

Figure 17A:
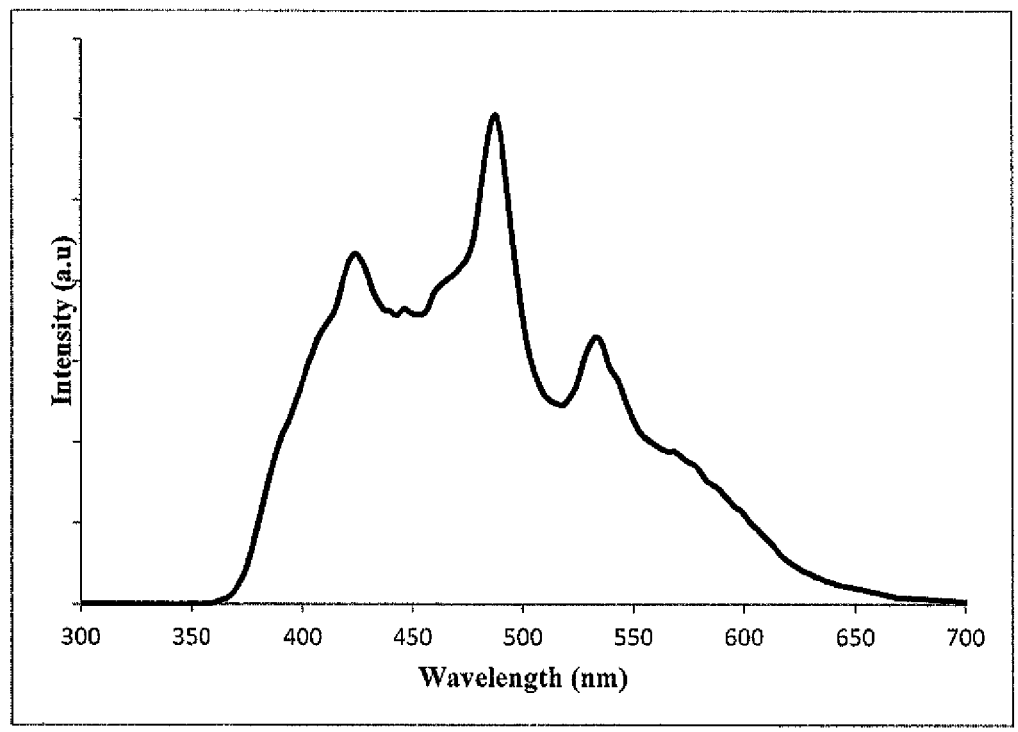
FIG. 17 shows emission spectra of $Na_{0.1}Ca_{1.8}Mn_{0.1}Ce_{0.04}GeO_4F$ at (a) 220 nm excitation, (b) 365 nm and (c) 318 nm excitation.
Figure 17B:
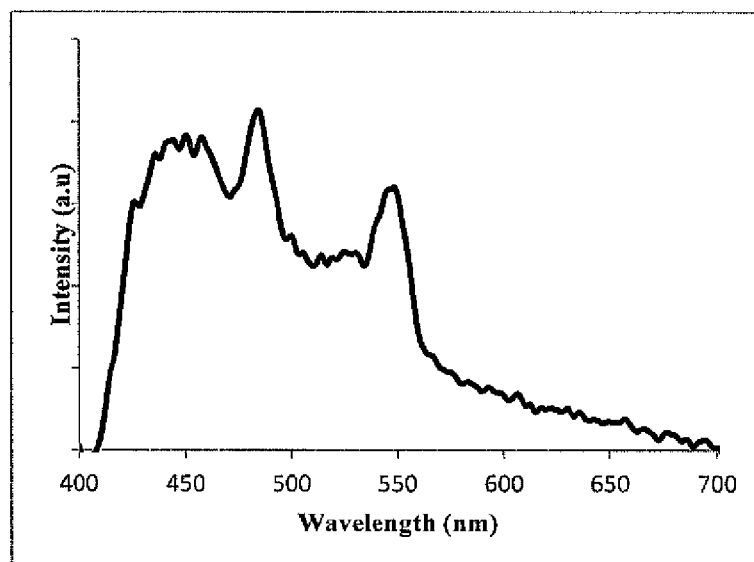
Figure 17C:
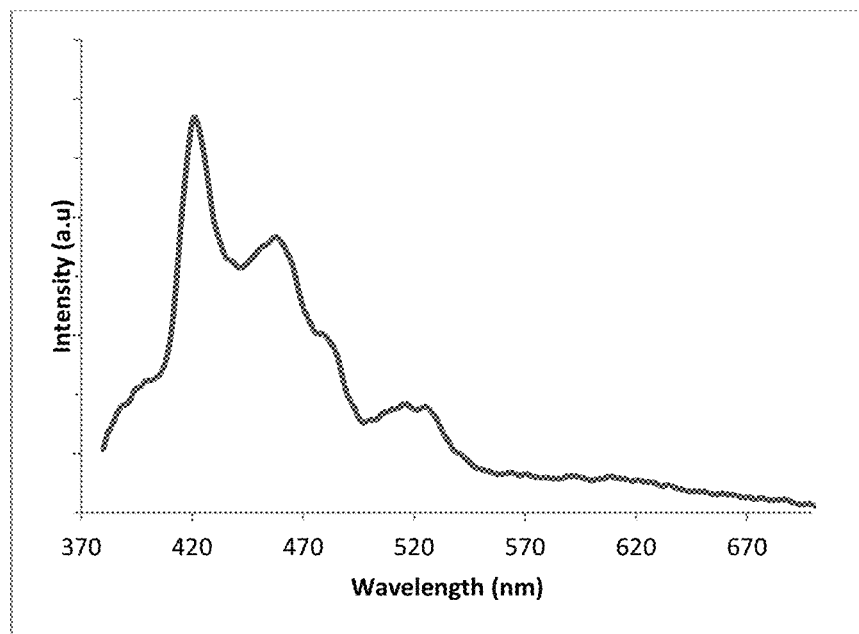

$Mn^{2+}$ has a $3d^5$ electronic configuration and the optical absorption transitions are parity and spin forbidden and hence $Mn^{2+}$ d–d absorption transitions do not occur readily. $Ce^{3+}$ acts as sensitizer and transfers energy to $Mn^{2+}$ causing a bright yellow luminescence at 220 nm excitation. Peaks at 423 nm and 487 nm are due to $Ce^{3+}$ 5d to $^7F_{3/2}$ and $^7F_{5/2}$ transitions and the $^4T_1 \rightarrow ^6A_1$ transition creates a peak at 534 nm for $Na_{1.04}Ca_{1.8}Mn_{0.1}Ce_{0.04}GeO_4F$ as shown in FIG. 19a. Excitation spectra at 365 nm and 318 nm are also shown (FIGS. 17b and 17c).

Figure 18A:
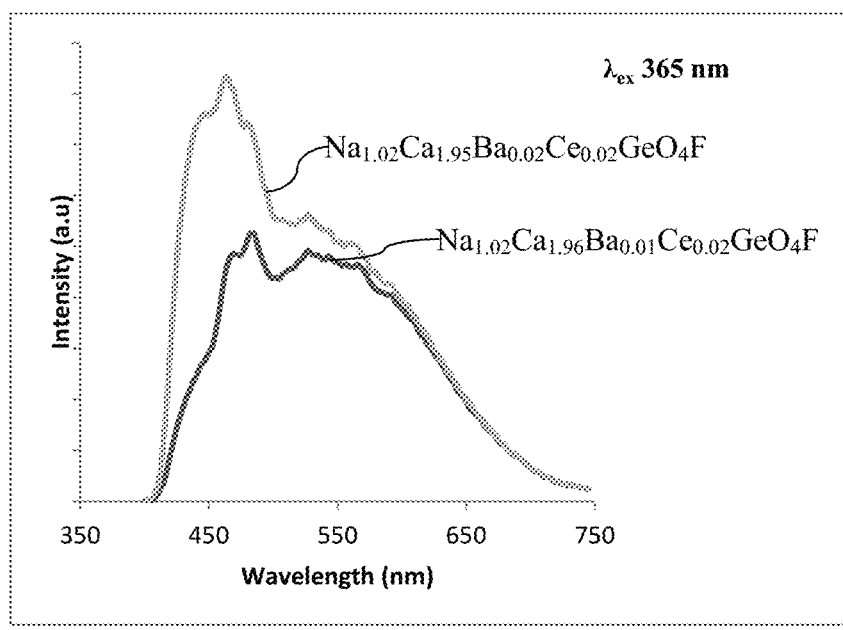
FIG. 18a and FIG. 18b show[[s]] emission spectra of $Na_{1.02}Ca_{1.95}Ba_{0.02}Ce_{0.02}GeO_4F$ and $Na_{1.02}Ca_{1.96}Ba_{0.01}Ce_{0.02}GeO_4F$ at 365 nm excitation (FIG. 18a) and $Na_{1.02}Ca_{1.96}Ba_{0.01}Ce_{0.02}GeO_4F$ at 254 nm excitation (FIG. 18b)
Figure 18B:
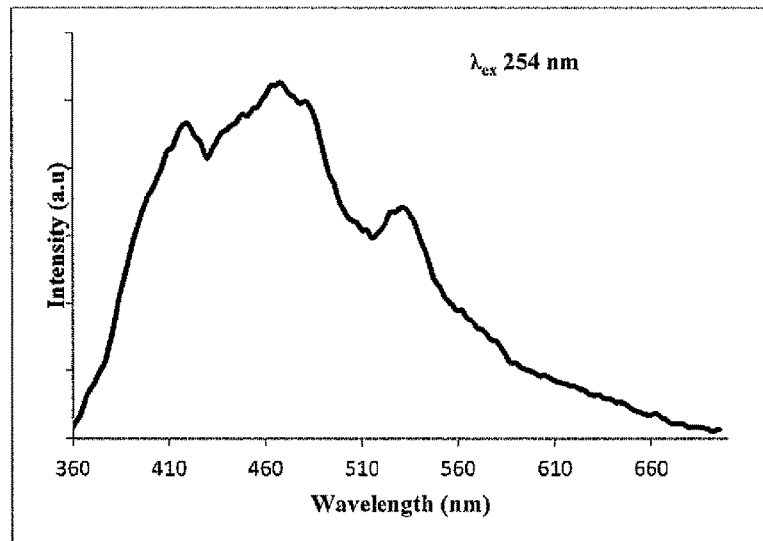

Photoluminescence of $Ce^{3+}$ Doped $NaCa_{2-x}Ba_xGeO_4F$ $Ce^{3+}$ doped $NaCa_{2-x}Ba_xGeO_4F$ show yellowish green luminescence under 254 nm and blue-green luminescence under 365 nm wavelength UV light due to electronic transition from 5d to 4f ($^2F_{5/2}$ and $^2F_{7/2}$) making it a suitable phosphor for both near and far UV excitation (FIG. 18).

When $Ba^{2+}$ substituted materials are doped with $Ce^{3+}$ broad emission peak in the yellow-green region is observed.

Photoluminescence of $Eu^{2+}$ Doped $NaCa_{2-x}Ba_xGeO_4F$

Figure 19:
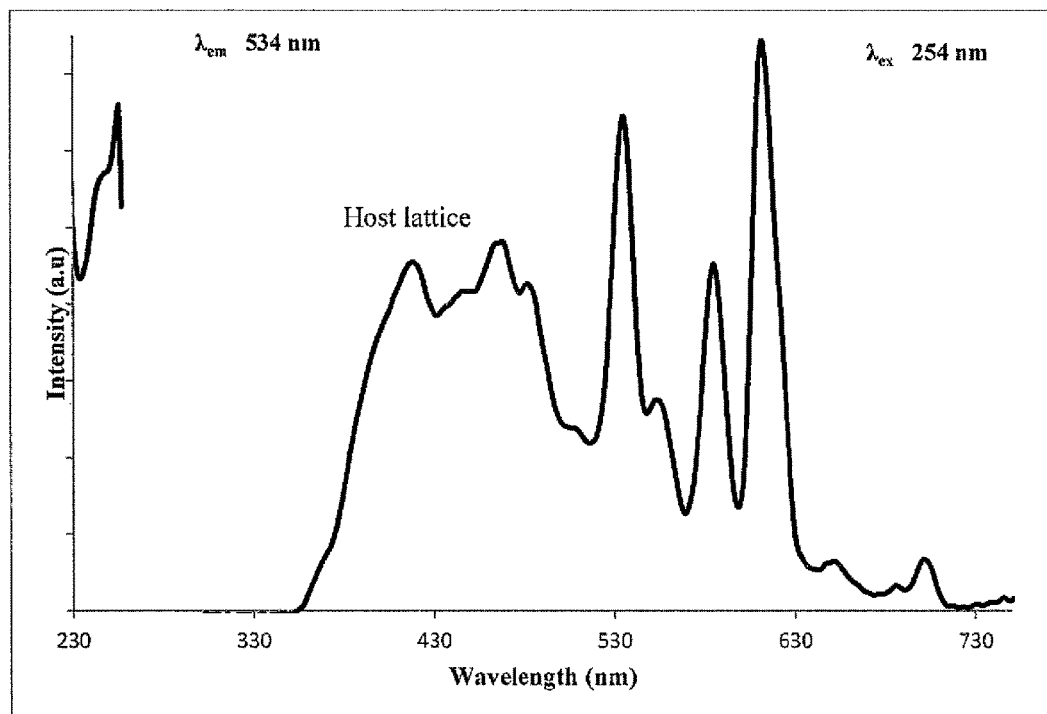
FIG. 19 shows excitation and emission spectra of $Na_{1.01}Ca_{1.97}Ba_{0.01}Eu_{0.01}GeO_4F$ under 254 nm excitation.
Figure 20:
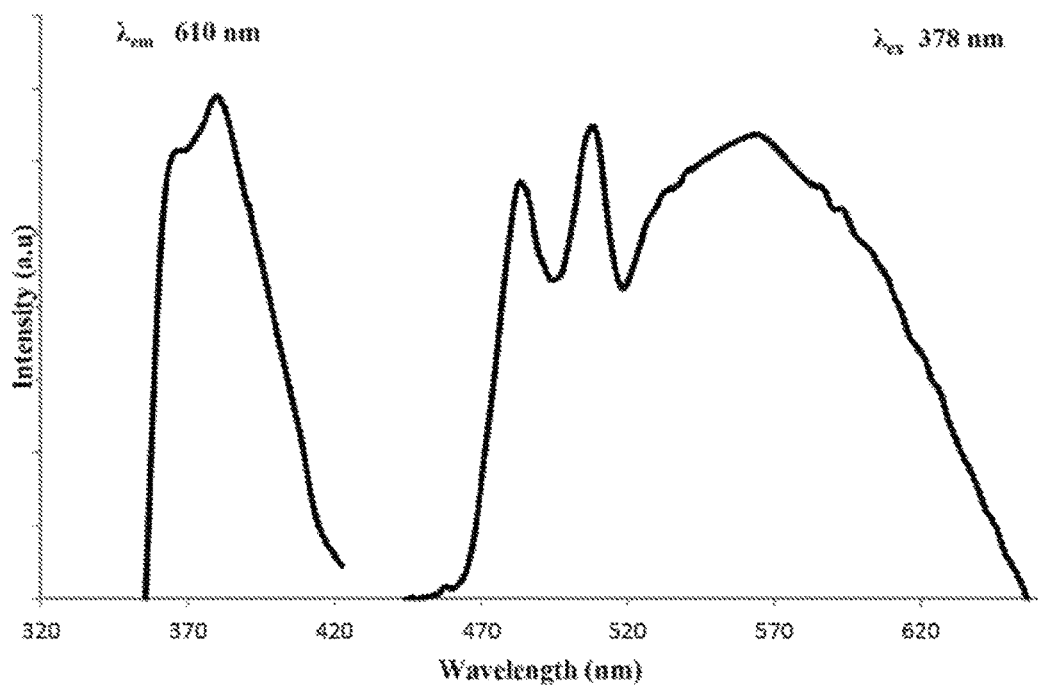
FIG. 20 shows excitation and emission spectra of $Na_{1.02}Ca_{1.94}Ba_{0.02}Eu_{0.02}GeO_4F$ at 610 nm emission exhibiting peak at 378 nm.
Figure 21:
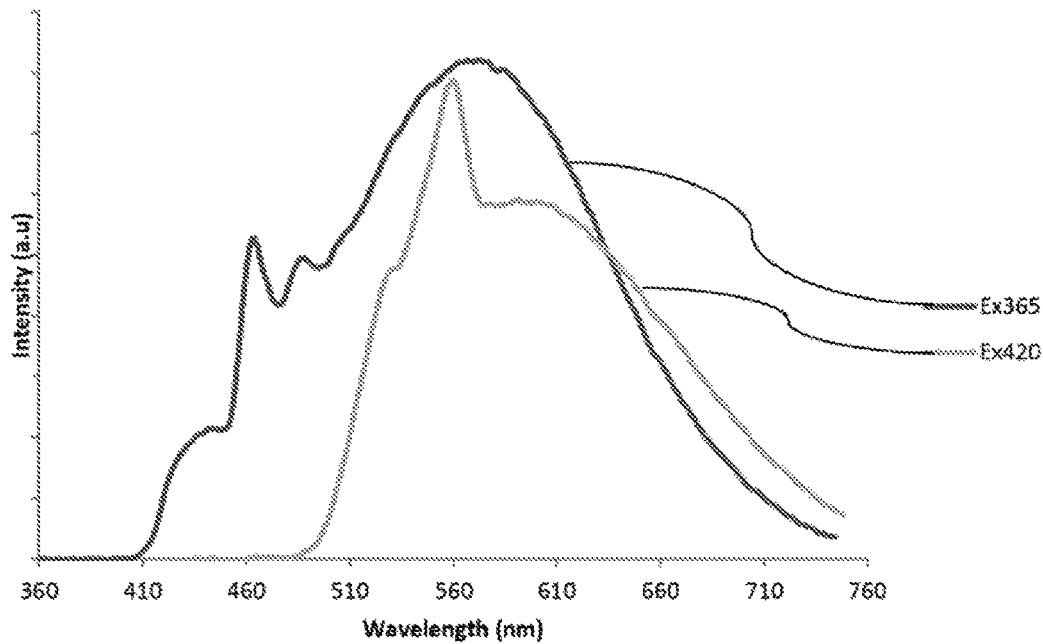
FIG. 21 shows emission spectra of $Na_{1.02}Ca_{1.94}Ba_{0.02}Eu_{0.02}GeO_4F$ at 365 nm and 420 nm excitation.
Figure 22:
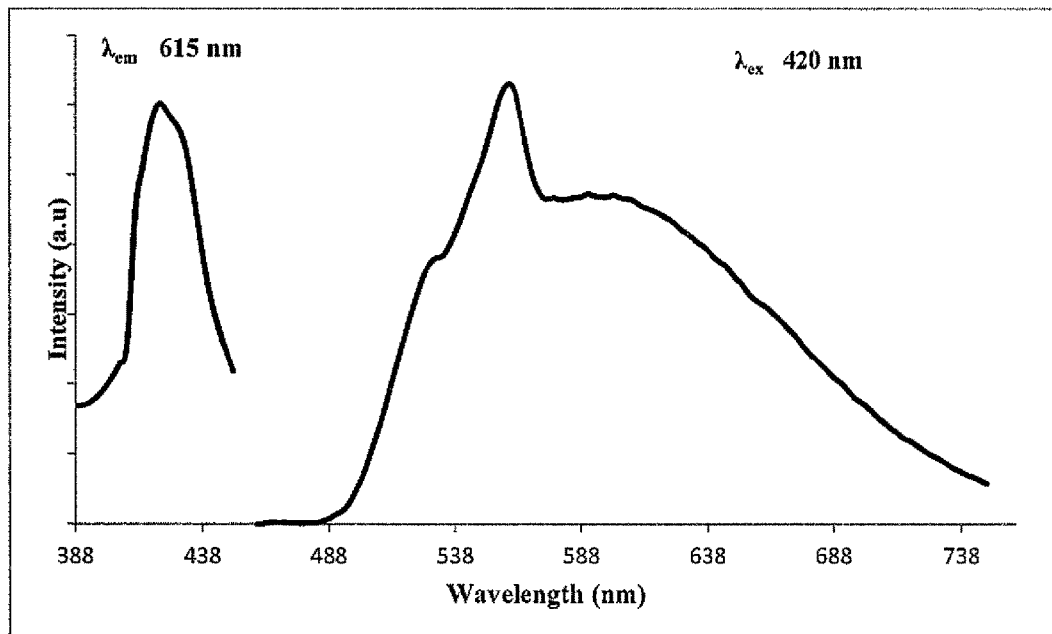
FIG. 22 shows excitation and emission spectra of $Na_{1.02}Ca_{1.94}Ba_{0.02}Eu_{0.02}GeO_4F$ at 615 nm emission and 420 nm excitation.

Emission spectra of $Na_{1.01}Ca_{1.97}Ba_{0.01}Eu_{0.01}GeO_4F$ synthesized under the flow of 95% Ar/5% $H_2$ gas at 254 nm excitation is shown in FIG. 19. At 254 nm the excitation peaks appears at 425, 466, 480 nm due to the host lattice and at 535, 612 and 648 nm due to $Eu^{3+}$ and at 555 nm due to $5d^14f^6 \rightarrow 4f^7$ transition of $Eu^{2+}$. As the characteristic line emission of $Eu^{3+}$ are seen for excitation at 254 nm it is evident that both $Eu^{2+}$ and $Eu^{3+}$ are present in the system. For the emission wavelength of 610 nm the excitation band in the 360 to 380 nm range with maximum at 378 nm originating from $O^{2-} \rightarrow Eu^{3+}$ charge transfer band caused by electron transfer from 2p orbitals of $O^{2-}$ ion to 4f orbitals of $Eu^{3+}$ ion, was observed (FIG. 20). Excitation spectra of $Na_{1.02}Ca_{1.94}Ba_{0.02}Eu_{0.02}GeO_4F$ shows a band from 390 nm to 445 nm with maxima at 420 nm due to the $4f^7 \rightarrow 4f^65d^1$ allowed transition of $Eu^{2+}$ ion (FIG. 21). The 4f electron of $Eu^{2+}$ can be excited to the 5d energy level as the 5d level overlaps with lower energy 4f level. At 420 nm excitation peaks at 490 nm, 525 nm and 549 nm are seen originating from the transitions $^5D_1 \rightarrow ^7F_2$, $^5D_0 \rightarrow ^7F_0$, $^5D_0 \rightarrow ^7F_1$. A slight shift towards longer wavelength with increasing $Eu^{2+}/Eu^{3+}$ concentration has been observed. This Europium doped material can be used as a suitable phosphor for excitation by near UV or blue emitting $In_xGa_{1-x}N$ LEDs. At 365 nm excitation peaks appear at 464 nm and 480 nm due to the host lattice and broad emission in the range of 530 to 612 nm due to $5d^14f^6 \rightarrow 4f^7$ transition of $Eu^{2+}$.

Figure 23:
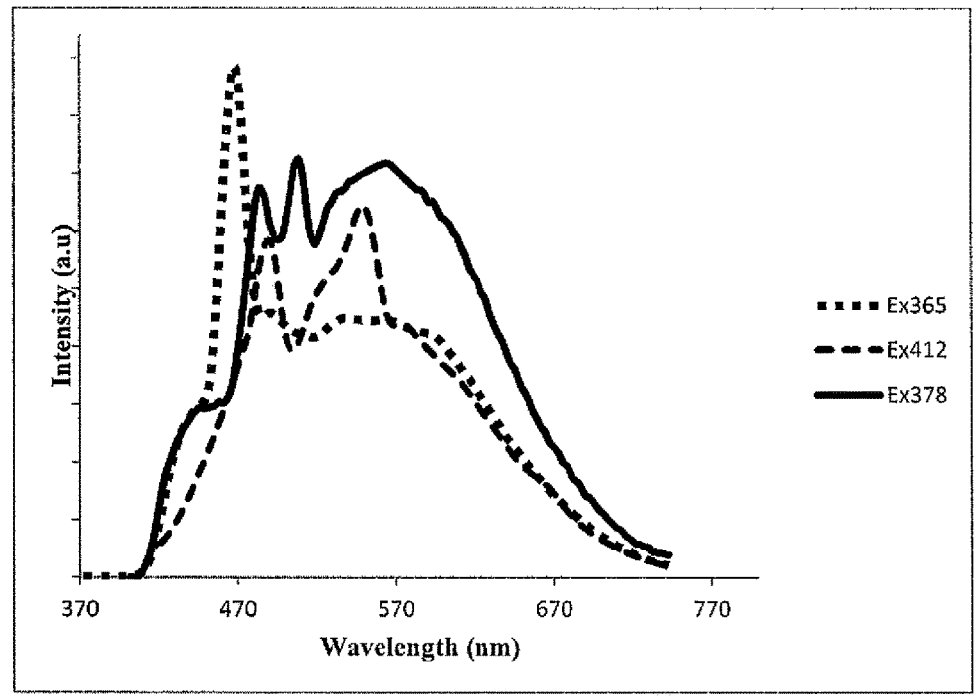
FIG. 23 shows emission spectra of $Na_{1.01}Ca_{1.97}Ba_{0.01}Eu_{0.01}GeO_4F$ at the excitation wavelengths of 365 nm, 378 nm and 412 nm.

A comparison of emission spectra of $Na_{1.01}Ca_{1.97}Ba_{0.01}Eu_{0.01}GeO_4F$ at the excitation wavelengths of 365 nm, 378 nm and 412 nm is shown in FIG. 23. Broad emission bands from 500 to 620 nm range with sharp peaks at 468 and 483 nm are observed at 365 nm and 378 nm excitation and at 412 nm excitation peaks appear at 487 nm, 545 nm and broad peak from 557 nm to 620 nm.

CONCLUSION

Structural and photoluminescent characterization of $NaCa_2GeO_4F$ and a series of rare earth doped materials of the same compound show that $NaCa_2GeO_4F$ is a stable new host lattice for UV phosphors when doped with rare earth. Certain materials can also be new candidates for host materials to be used as phosphor for blue light emitting diodes. $Ba^{2+}$ substitution in the calcium site creates self-activating phosphor and the CIE values can be engineered by varying the concentration of the substituent atoms and rare earth elements. The $Mn^{2+}$ activated material shows prominent yellow luminescence and this system need to be investigated in more detail.

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged either in whole or in part. Furthermore, those of ordinary skill in the art will appreciate that the foregoing description is by way of example only, and is not intended to limit the invention so further described in the appended claims.

What is claimed:

1. A composition comprising an oxyfluoride compound having the formula:

where A is Ba, Sr, or a mixture thereof; $0.01 \leq x \leq 0.1$; $0 \leq y \leq 0.2$; and $0 \leq z \leq 0.1$.

2. The composition as in claim 1, wherein z is 0.
3. The composition as in claim 1, wherein y is 0.
4. The composition as in claim 1, wherein the oxyfluoride compound has the formula:

wherein A is Ba, Sr, or a mixture thereof; and wherein $0.01 \leq x \leq 0.1$.

5. The composition as in claim 1, wherein A is Ba.
6. The composition as in claim 1, wherein A is Sr.
7. The composition as in claim 1, wherein $0.01 \leq x \leq 0.06$.
8. The composition as in claim 1, further comprising: an activator ion coupled with the compound.
9. A composition comprising an oxyfluoride compound having the formula:

where A is Ba, Sr, or a mixture thereof; $0 \leq x \leq 0.1$; $0 \leq y \leq 0.2$; and $0 \leq z \leq 0.1$; and an activator ion coupled with the compound.

10. The composition as in claim 9, wherein x is 0.
11. The composition as in claim 9, wherein z is 0 and y is 0.
12. The composition as in claim 9, wherein the activator ion comprises an ion of an element selected from the group consisting of La, Ac, Ce, Pr, Nd, Sm, Eu, Gd, Tb, Dy, Ho, Er, Tm, Yb, Th, U, Cr, Mn, Tc, Re, Cu, Ag, Au, Zn, Cd, Hg, As, Sb, Bi, Ge, Sn, Pb, In, Tl, and mixtures thereof.
13. The composition as in claim 9, wherein the activator ion comprises an ion of Eu, Ce, Tb, or a mixture thereof.
14. The composition as in claim 9, wherein the activator ion comprises $Eu^{3+}$, $Ce^{3+}$, $Tb^{3+}$, or a mixture thereof.
15. A method of doping a compound having the formula: $NaCa_2GeO_{4-z}F_{1-y}N_z$ where $0 \leq y \leq 0.2$; and $0 \leq z \leq 0.1$, the method comprising:
   introducing defects into the compound by substituting a portion of the Ca ions with ions of Ba, Sr, or a mixture thereof.

* * * * *